(12) United States Patent
Liu et al.

(10) Patent No.: US 11,145,678 B2
(45) Date of Patent: *Oct. 12, 2021

(54) METHOD FOR MANUFACTURING SEMICONDUCTOR DEVICE

(71) Applicant: TAIWAN SEMICONDUCTOR MANUFACTURING COMPANY LTD., Hsinchu (TW)

(72) Inventors: Jack Liu, Taipei (TW); Jiann-Tyng Tzeng, Hsinchu (TW); Chih-Liang Chen, Hsinchu (TW); Chew-Yuen Young, Cupertino, CA (US); Sing-Kai Huang, Yunlin County (TW); Ching-Fang Huang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/703,483

(22) Filed: Dec. 4, 2019

(65) Prior Publication Data

US 2020/0105795 A1    Apr. 2, 2020

Related U.S. Application Data

(62) Division of application No. 15/939,876, filed on Mar. 29, 2018, now Pat. No. 10,510,776.

(51) Int. Cl.
*H01L 27/12* (2006.01)
*H01L 21/762* (2006.01)
(Continued)

(52) U.S. Cl.
CPC ........ *H01L 27/1211* (2013.01); *H01L 21/761* (2013.01); *H01L 21/76264* (2013.01); *H01L 21/845* (2013.01); *H01L 29/1083* (2013.01)

(58) Field of Classification Search
CPC ............ H01L 21/761; H01L 21/76264; H01L 29/1083; H01L 29/94; H01L 21/845;
(Continued)

(56) References Cited

U.S. PATENT DOCUMENTS 5,485,027 A    1/1996  Williams et al.
5,920,089 A *  7/1999  Kanazawa ........ H01L 27/11807
                                                      257/202
(Continued)

FOREIGN PATENT DOCUMENTS

CN    1449051 A      10/2003
CN    101320744 A    12/2008
CN    107248514 A    10/2017

OTHER PUBLICATIONS

Office Action and Search Report dated Mar. 30, 2020 issued by Taiwan Intellectual Property Office for counterpart application No. 107142130.

(Continued)

*Primary Examiner* — Thanh Y. Tran
(74) *Attorney, Agent, or Firm* — WPAT, P.C.; Anthony King

(57) ABSTRACT

A method for manufacturing a semiconductor device includes following operations. A substrate including an active area is received. A plurality of source/drain regions of a plurality of transistor devices are formed in the active area. An isolation region is inserted between two adjacent source/drain regions of two adjacent transistor devices. The isolation region and the two adjacent source/drain regions cooperatively form two diode devices electrically connected in a back to back manner.

20 Claims, 23 Drawing Sheets

(51) Int. Cl.
*H01L 21/761* (2006.01)
*H01L 21/84* (2006.01)
*H01L 29/10* (2006.01)

(58) Field of Classification Search
CPC ............. H01L 27/1211; H01L 21/8249; H01L 27/0251; H01L 27/0255; H01L 27/11807; H01L 27/14643; H01L 27/14689
See application file for complete search history.

(56) References Cited

U.S. PATENT DOCUMENTS

| | | | |
|---|---|---|---|
| 5,955,775 A | 9/1999 | Miwa | |
| 10,510,776 B2* | 12/2019 | Liu | ................. H01L 21/823431 |
| 2005/0142791 A1 | 6/2005 | Williams et al. | |
| 2010/0032728 A1* | 2/2010 | Hao | ...................... H01L 27/088 |
| | | | 257/262 |
| 2014/0061737 A1 | 3/2014 | Hsu et al. | |
| 2015/0021687 A1* | 1/2015 | Tamura | ................... H01L 29/06 |
| | | | 257/343 |

OTHER PUBLICATIONS

Office Action, Cited Reference and Search Report dated Mar. 3, 2021 issued by the China National Intellectual Property Administration for Chinese Counterpart Application No. 201811440548.2.
Office Action, Cited Reference and Search Report dated Sep. 1, 2021 issued by the China National Intellectual Property Administration for Chinese Counterpart Application No. 201811440548.2.

* cited by examiner

METHOD FOR MANUFACTURING SEMICONDUCTOR DEVICE

PRIORITY CLAIM AND CROSS-REFERENCE

This patent is a divisional application of U.S. patent application Ser. No. 15/939,876 filed on Mar. 29, 2018, entitled of "SEMICONDUCTOR DEVICE WITH COMMON ACTIVE AREA AND METHOD FOR MANUFACTURING THE SAME", which is incorporated by reference in its entirety.

BACKGROUND

Isolation regions such as shallow trench isolations (STIs) are used to provide expected isolation effect between adjacent semiconductor devices such as metal oxide semiconductor (MOS) devices. To improve performance of MOS devices, stress engineering such as application of silicon germanium (SiGe) source/drain regions is integrated into the MOS devices. In addition, continuous active area shared by adjacent MOS devices is proposed to further enhance performance of MOS devices. There is a need to provide sufficient isolation effect between the source/drain regions of adjacent MOS devices in a continuous active area.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
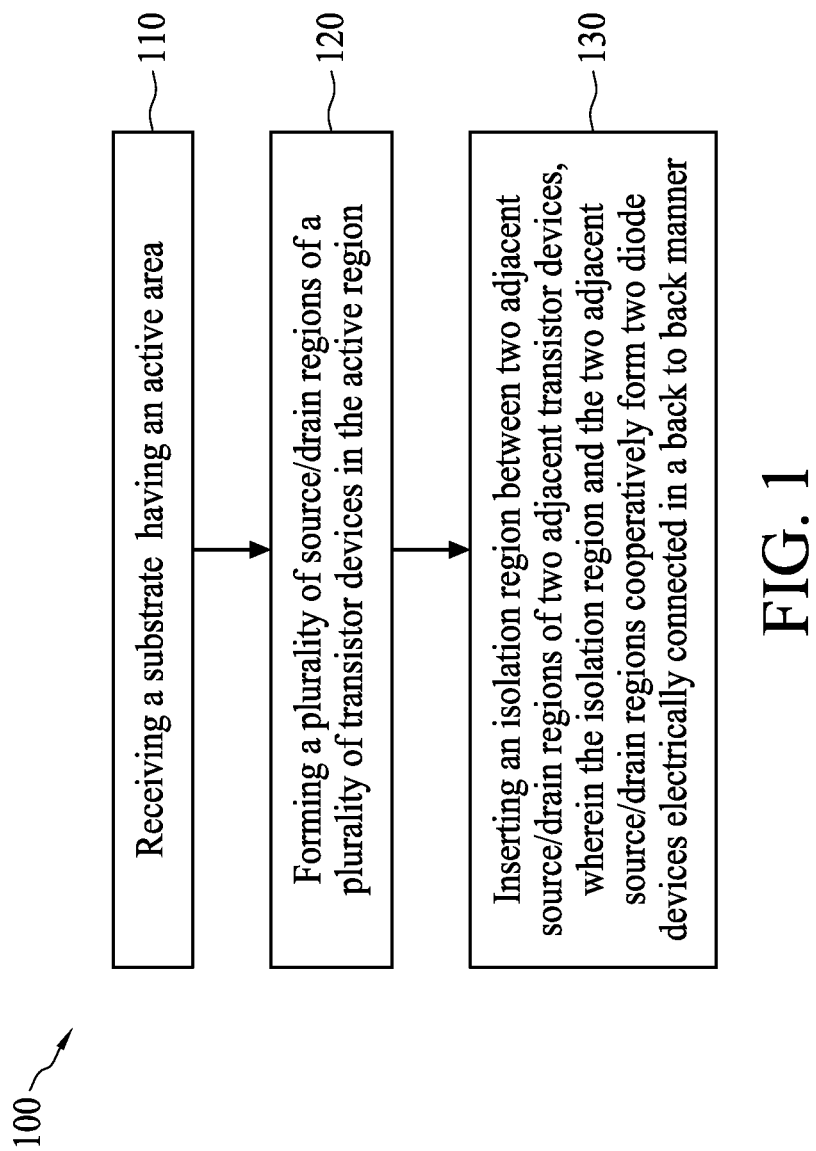
FIG. 1 is a flow chart illustrating a method for manufacturing a semiconductor device according to various aspects of one or more embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second," and "third" describe various elements, components, regions, layers and/or sections, these elements, components, regions, layers and/or sections should not be limited by these terms. These terms may be only used to distinguish one element, component, region, layer or section from another. The terms such as "first," "second," and "third" when used herein do not imply a sequence or order unless clearly indicated by the context.

As used herein, the terms "approximately," "substantially," "substantial," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In one or more embodiments of the present disclosure, a semiconductor device including an isolation region between a pair of source/drain regions of adjacent transistor devices is provided. The isolation region has a doping type opposite to the doping type of the source/drain regions. The pair of source/drain regions and the isolation region cooperatively form two diode devices connected in a back to back manner. The back-to-back connected diode devices are able to provide lateral isolation between the source/drain regions of adjacent transistor devices as long as the voltage difference between the positive node and the negative node of the diode device is lower than the breakdown voltage of the diode device.

FIG. 1 is a flow chart illustrating a method for manufacturing a semiconductor device according to various aspects of one or more embodiments of the present disclosure. The method 100 begins with operation 110 in which a semiconductor substrate is received. The semiconductor substrate includes a semiconductor layer formed thereon. The semiconductor layer includes an active area. The method 100 continues with operation 120 in which a plurality of source/drain regions of a plurality of transistor devices are formed in the active area. The method 100 proceeds with operation 130 in which an isolation region is inserted between two adjacent source/drain regions of two adjacent transistor devices, wherein the isolation region and the two adjacent source/drain regions cooperatively form two diode devices electrically connected in a back to back manner.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2:
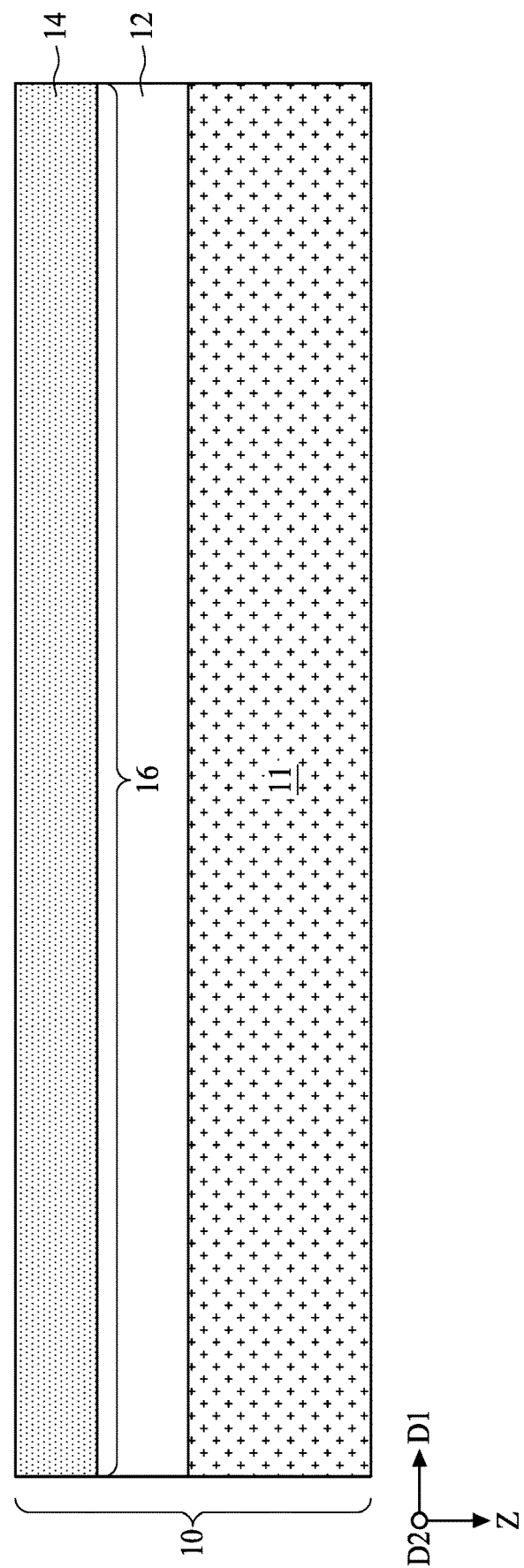
FIGS. 2-10 are schematic views at one of various operations of manufacturing a semiconductor device according to one or more embodiments of the present disclosure.
Figure 8:
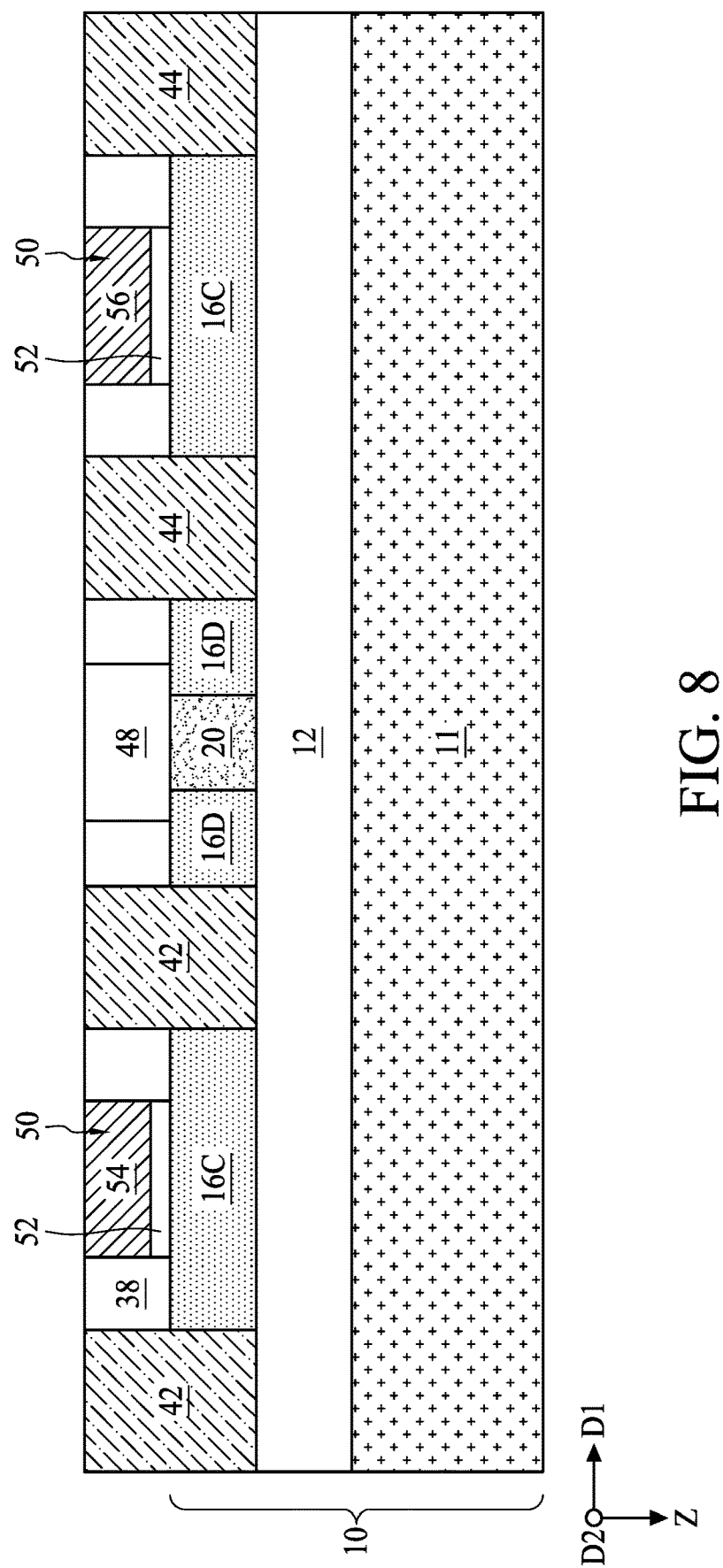
Figure 9:
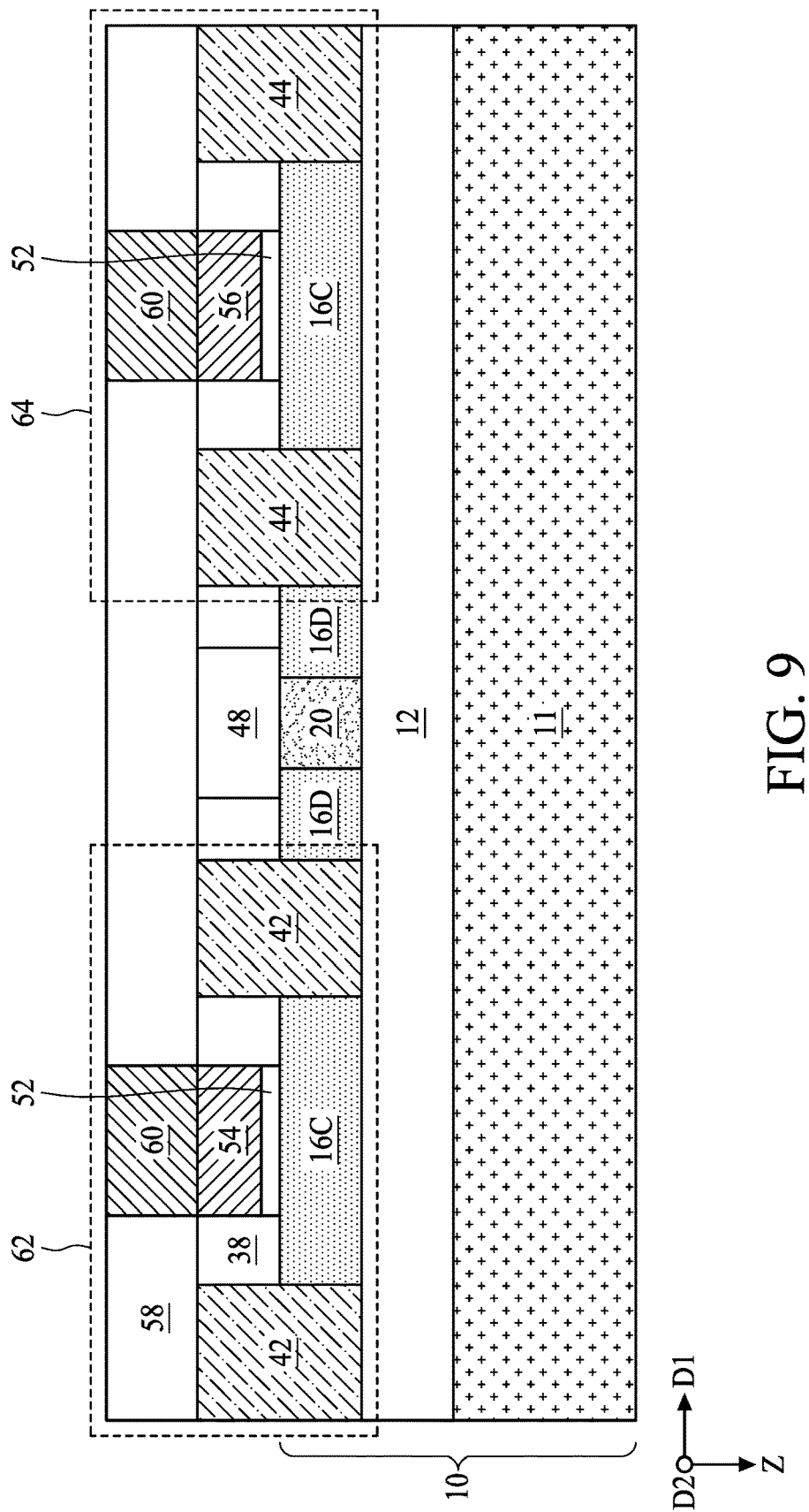
Figure 10:
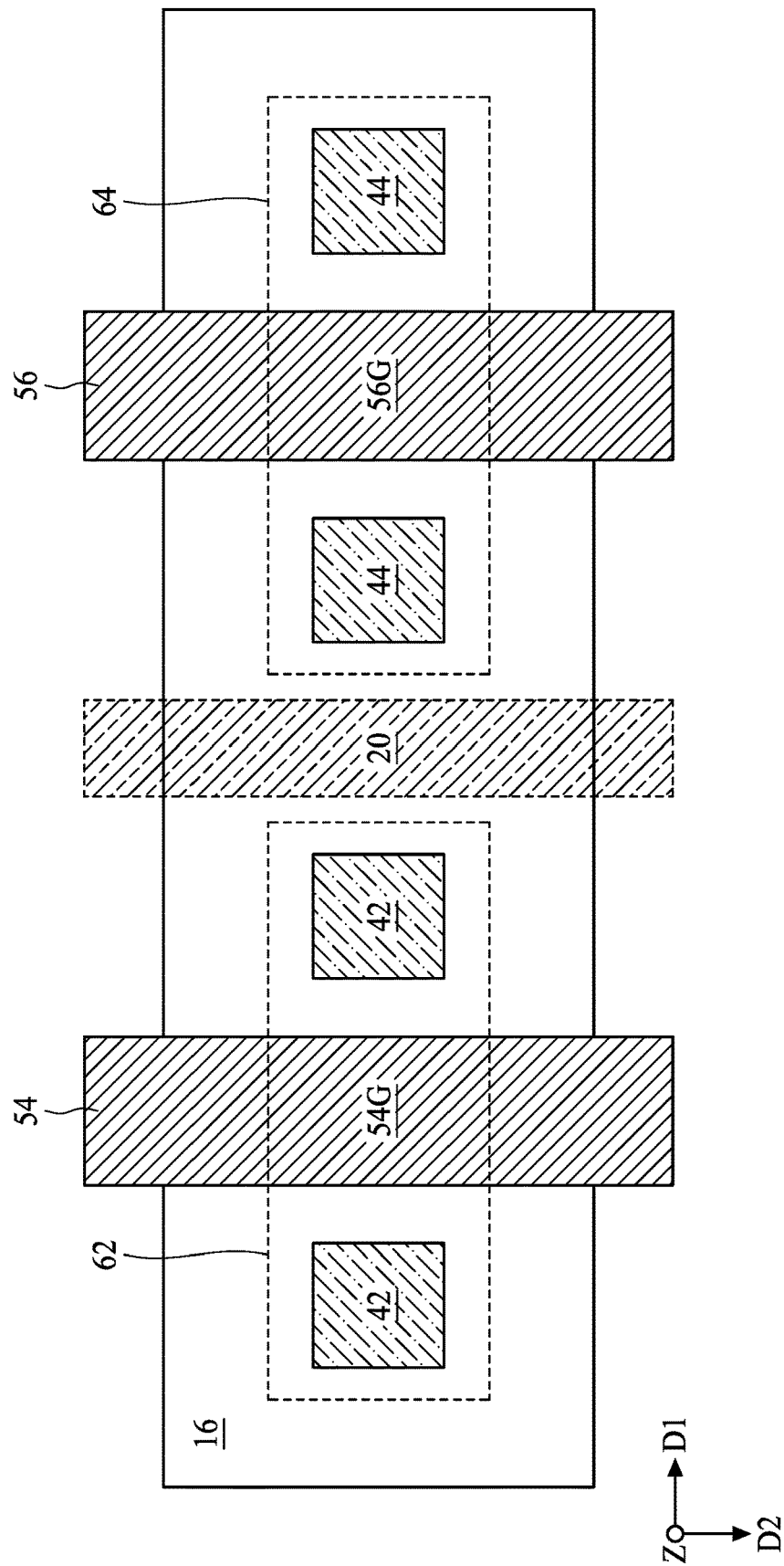

FIGS. 2-10 are schematic views at one of various operations of manufacturing a semiconductor device according to one or more embodiments of the present disclosure, where FIGS. 2-9 are schematic cross-sectional views, and FIG. 10 is a schematic top view. As shown in FIG. 2, a substrate 10 is received. In some embodiments, the substrate 10 may include a composite substrate such as a semiconductor-on-insulator (SOI) substrate. By way of example, the substrate 10 may include a semiconductor base 11, an insulation layer 12 over the semiconductor base 11, and a semiconductor layer 14 over the insulation layer 12. The material of the semiconductor base 11 may comprise elementary semiconductor such as silicon or germanium; a compound semiconductor such as silicon germanium, silicon carbide, gallium arsenic, gallium phosphide, indium phosphide or indium arsenide; or combinations thereof. The insulation layer 12 may include any suitable insulative materials. By way of example, the insulation layer 12 may include a semiconductor oxide layer such as a silicon oxide layer, and is configured as a buried oxide. The semiconductor layer 14 may be formed from the same material as the semiconductor base 11, but is not limited thereto. In some embodiments, the substrate 10 is a fully depleted silicon-on-insulator (FDSOI) substrate. In some alternative embodiments, the substrate 10 may include a bulk semiconductor substrate.

As shown in FIG. 2, a portion of the semiconductor layer 14 may be doped, forming an active area 16 extending along a first direction D1. The active area 16 has a first doping type. In some embodiments, the active area 16 is a common active area shared by multiple transistor devices arranged in the first direction D1. The continuous active area shared by multiple transistor devices is configured to preserve stress, thereby enhancing device performance, particularly for PMOS devices. In some embodiments, no dielectric isolation such as shallow trench isolation is interposed between the transistor devices in the active area 16. In some embodiments, dielectric isolation such as STI may be formed in the active area 16, but the dielectric isolation does not divide the active area 16 into separated areas, i.e., the active area 16 may still be connected to each other at the presence of the dielectric isolation.

Figure 3:
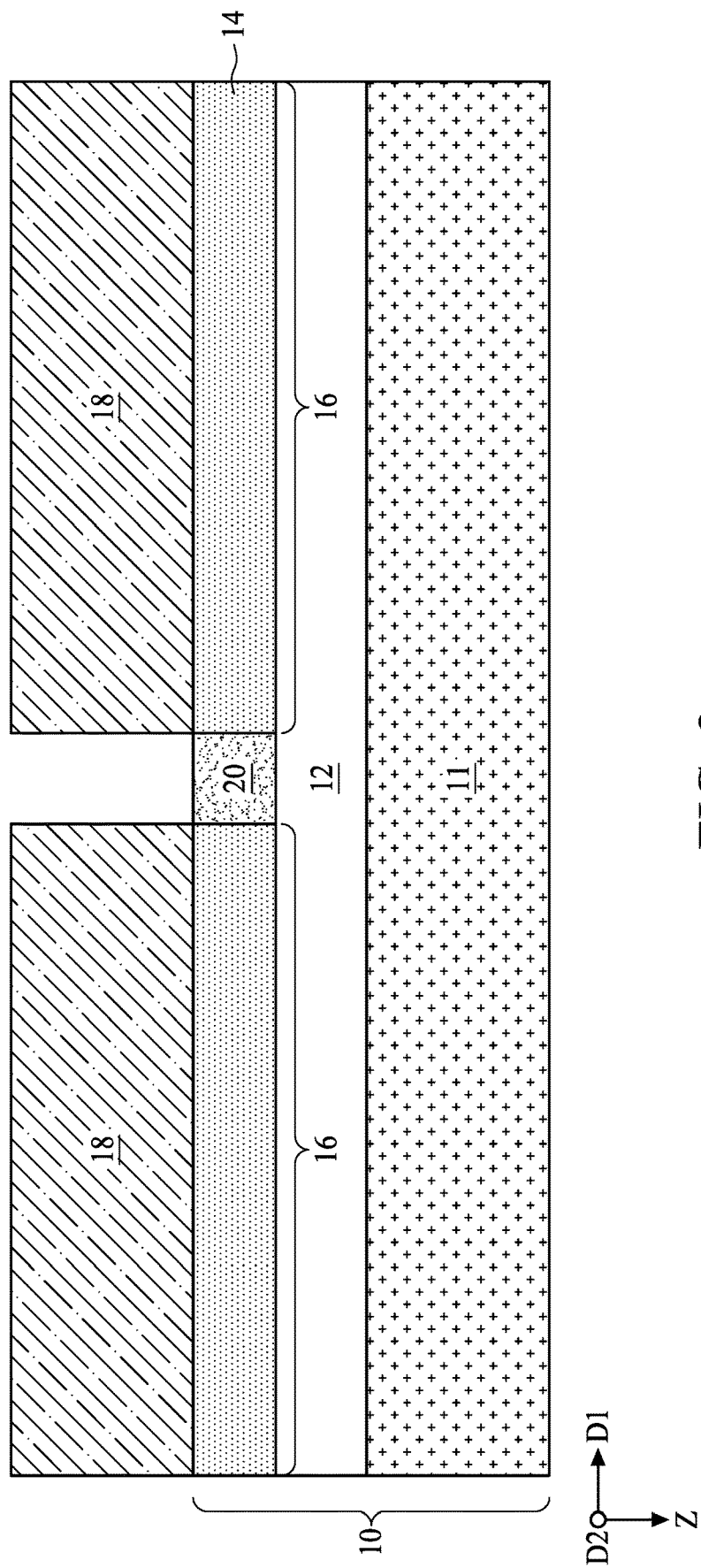

As shown in FIG. 3, an isolation region 20 is formed in the active area 16. The isolation region 20 is a doped region. In some embodiments, the isolation region 20 is formed in the active area 16 by an ion implantation. For example, the isolation region 20 may be implanted in the active area 16 using a patterned mask layer 18 such as a photoresist mask. The isolation region 20 may extend along a second direction D2. In some embodiments, the second direction D2 may be substantially perpendicular to the first direction D1. In some embodiments, the active area 16 and the isolation region 20 may have the same first doping type. The doping concentration of the isolation region 20 is higher than the doping concentration of the active area 16. In some embodiments, the thickness of the isolation region 20 is substantially equal to the thickness of the active area 16, but not limited thereto.

Figure 4:
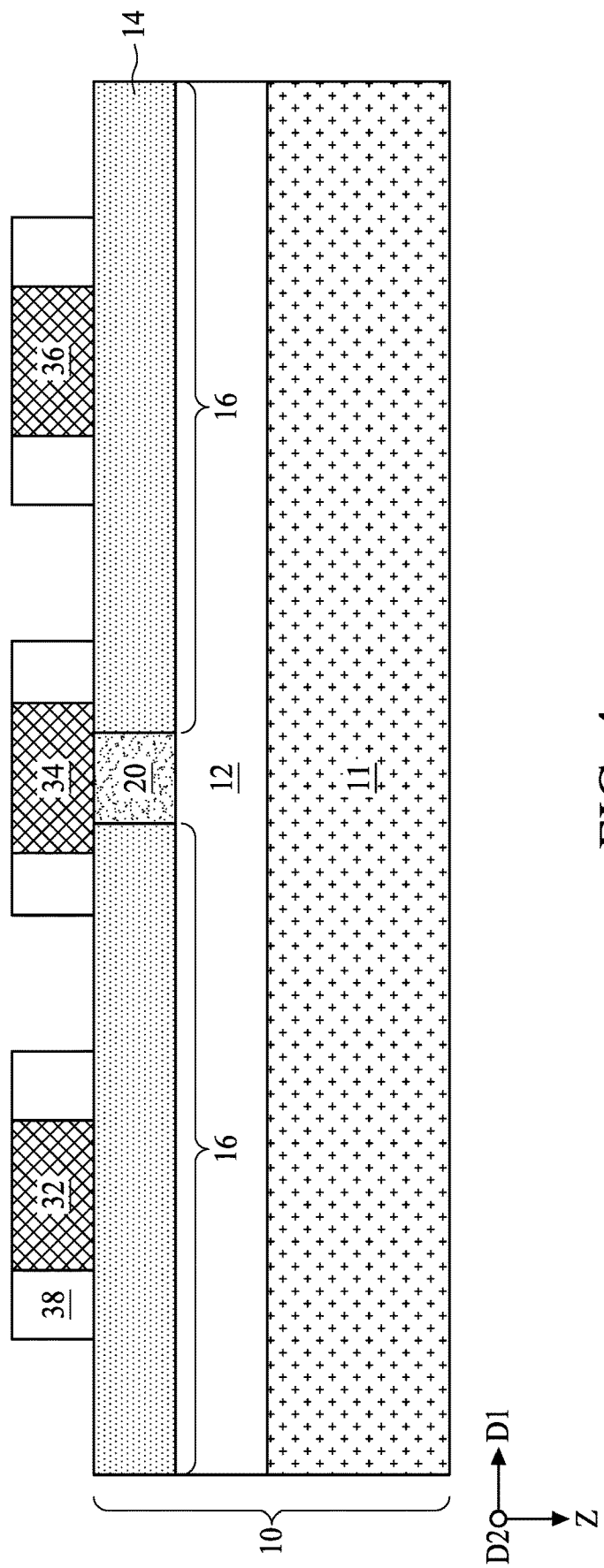

As shown in FIG. 4, the patterned mask layer 18 may be removed after the isolation region 20 is formed. Subsequently, a plurality of gate lines are formed over the substrate 10. In some embodiments, a first gate line 32, a second gate line 34 and a third gate line 36 are formed over the semiconductor layer 14. The first gate line 32, the second gate line 34 and the third gate line 36 may be arranged alternately in the first direction D1, and each of the first gate line 32, the second gate line 34 and the third gate line 36 may extend along the second direction D2. In some embodiments, the second gate line 34 overlaps the isolation region 20 in a vertical direction Z. In some embodiments, the first gate line 32, the second gate line 34 and the third gate line 36 are sacrificial gate lines, and will be removed in subsequent operations. The first gate line 32, the second gate line 34 and the third gate line 36 may include semiconductor gate lines such as polycrystalline gate lines, but are not limited thereto. In some embodiments, the dimension of the isolation region 20 may be smaller than the dimension of the second gate line 34, but is not limited thereto.

In some embodiments, side spacers 38 may be formed alongside the first gate line 32, the second gate line 34 and the third gate line 36. The material of the side spacers 38 may include oxide compound such as silicon oxide, nitride compound such as silicon nitride, a combination thereof, or other suitable dielectric materials.

Figure 5:
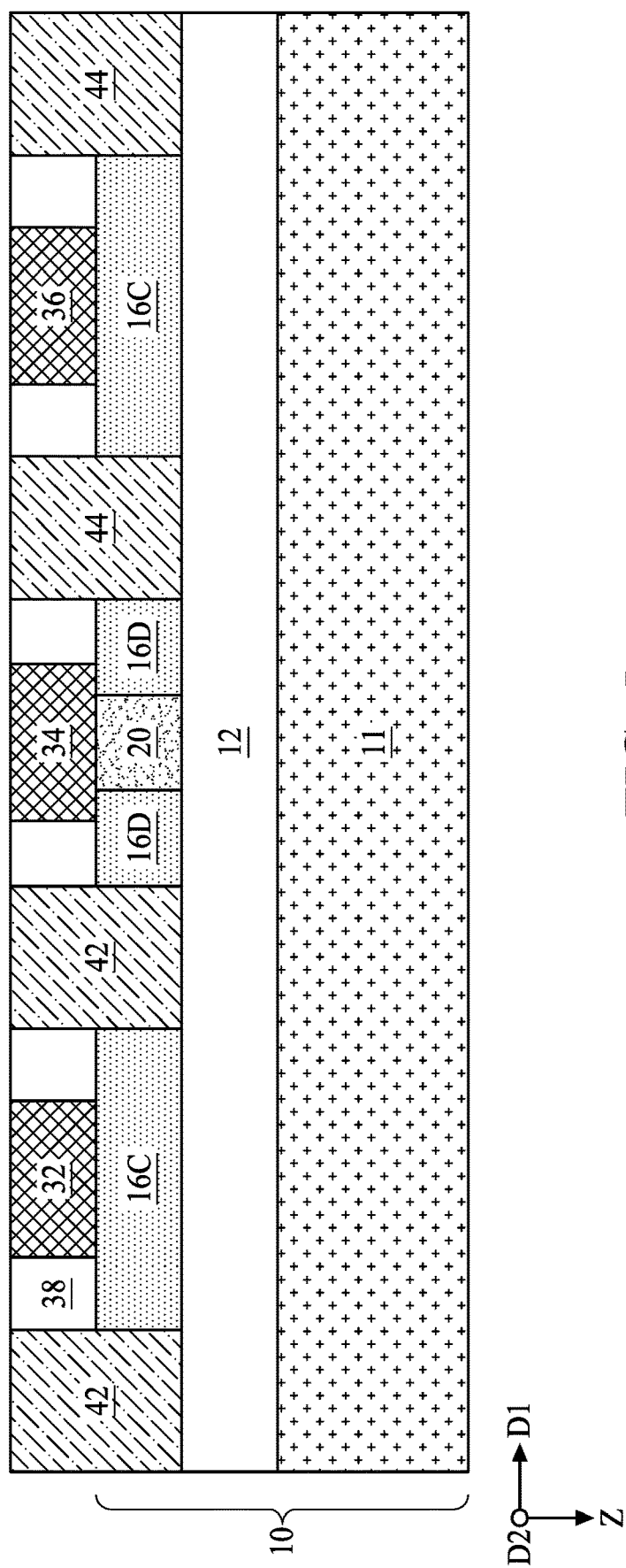

As shown in FIG. 5, a plurality of source/drain regions are formed over the substrate 10. By way of example, a pair of first source/drain regions 42 are formed alongside the first gate line 32, and a pair of second source/drain regions 44 are formed alongside the third gate line 36. In some embodiments, the first source/drain regions 42 and the second source/drain regions 44 may be formed by epitaxially growing a semiconductor material over the active area 16 exposed through the side spacers 38. In some embodiments, the semiconductor material for forming the first source/drain regions 42 and the second source/drain regions 44 is different from that of the semiconductor layer 14. By way of example, the semiconductor material for forming the first source/drain regions 42 and the second source/drain regions 44 may include silicon germanium (SiGe) or other suitable materials. In some embodiments, dopants may be formed in the first source/drain regions 42 and the second source/drain regions 44 along with formation of the first source/drain regions 42 and the second source/drain regions 44. In some other embodiments, dopants may be formed by an implantation operation. The first source/drain regions 42 and the second source/drain regions 44 may have a second doping type opposite to the first doping type of the isolation region 20. By way of example, the first doping type is P type, while the second doping type is N type.

In some embodiments, a thermal operation such as an anneal operation may be performed to drive in the dopants of the first source/drain regions 42 and the second source/drain regions 44 into the active area 16. In some embodiments, the first source/drain regions 42 and the second source/drain regions 44 may divide the active area 16 into several portions. For example, the portions of the active area 16 between the pair of the first source/drain regions 42 and between the pair of the second source/drain regions 44 are configured as two channels 16C of two adjacent transistor devices to be formed. The portions of the active area 16 between the first source/drain region 42 and the isolation region 20, and between the second source/drain region 44 and the isolation region 20 are configured as a pair of second isolation regions 16D. Accordingly, the second isolation regions 16D are disposed on two opposing sides of the isolation region 20. The doping concentration of the isolation region 20 is higher than the doping concentration of the pair of the second isolation regions 16D. In some embodiments, the thickness of the isolation region 20 is substantially equal to the thickness of the channel 16C, but not limited thereto.

Figure 6:
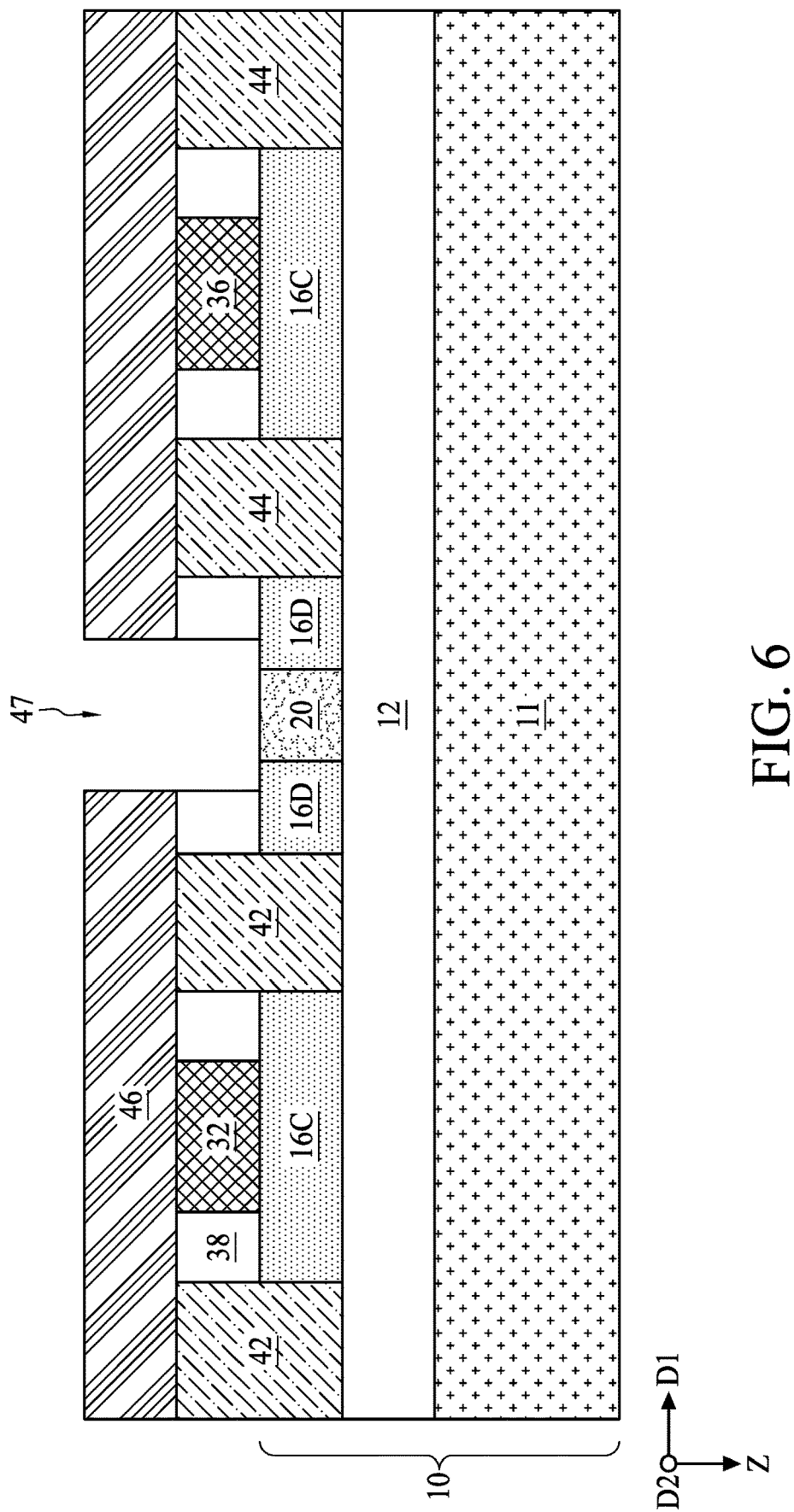

As shown in FIG. 6, the second gate line 34 is removed. In some embodiments, a patterned mask layer 46 may be formed, and the second gate line 34 exposed through the patterned mask layer 46 is removed by etching, for example, to form a recess 47 exposing the isolation region 20. In some embodiments, the dimension of the recess 47 is slightly larger than that of the isolation region 20, and the recess 47 may further, but is not limited to, expose a portion of the pair of the second isolation regions 16D.

Figure 7:
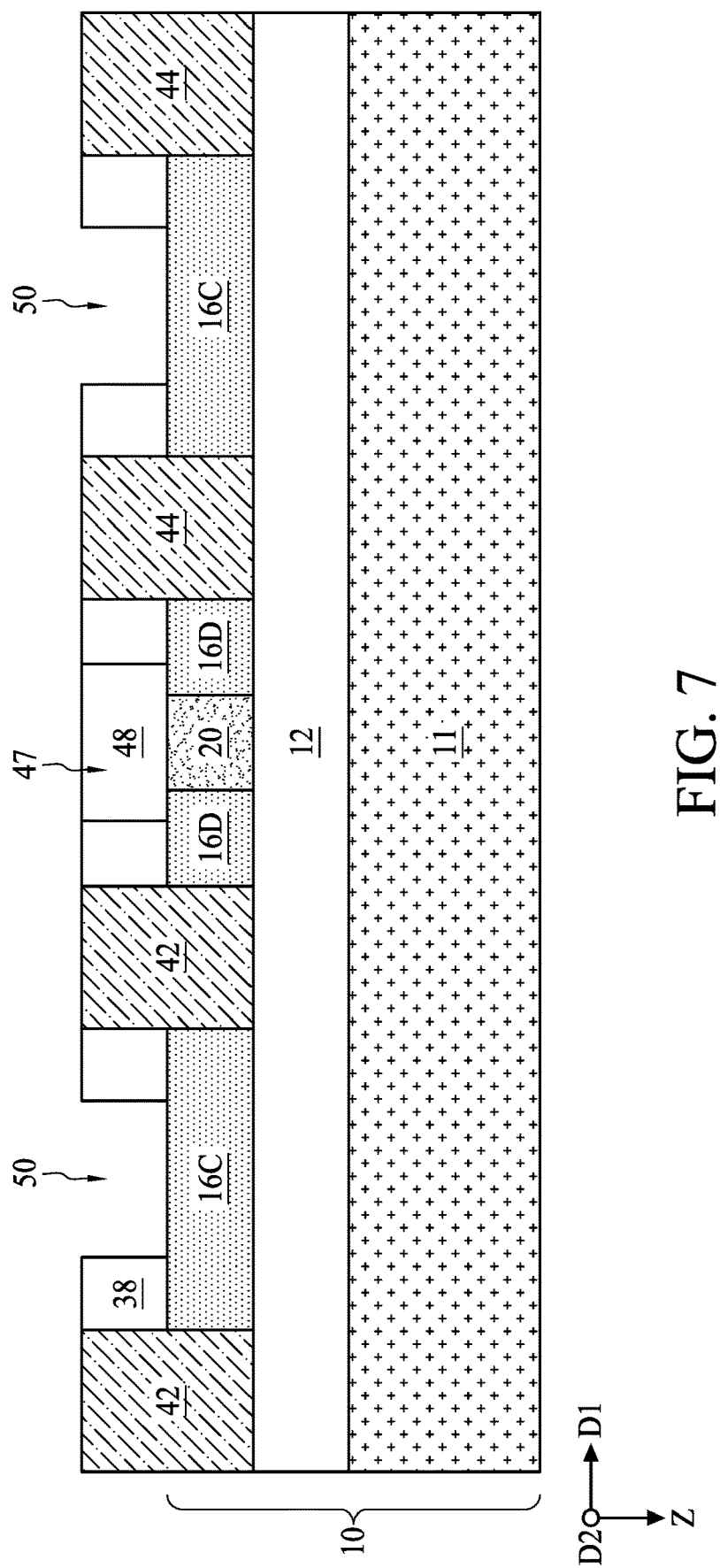

As shown in FIG. 7, the patterned mask layer 46 is removed. In some embodiments, a dielectric layer 48 is formed in the recess 47, covering the isolation region 20. The dielectric layer 48 may be formed over the substrate 10, and the dielectric layer 48 outside the recess 47 may be removed by, e.g., chemical mechanical polishing (CMP) or the like. In some embodiments, the first gate line 32 and the third gate 36 are removed to form recesses 50 exposing the channels 16C.

As shown in FIG. 8, gate dielectric layers 52 and metal gate lines such as a first metal gate line 54 and a second metal gate line 56 are formed in the recesses 50. In some embodiments, one or more metal layers may be formed over the substrate 10, and the one or more metal layers outside the recesses 50 may be removed by, e.g., chemical mechanical polishing (CMP) or the like to form the first metal gate line 54 and the second metal gate line 56.

As shown in FIG. 9 and FIG. 10, an inter-layered dielectric (ILD) 58 is formed over the substrate 10, and a plurality of contact vias 60 may be formed in the ILD 58 and electrically connected to the first metal gate line 54 and the second metal gate line 56 to form a semiconductor device 1. In some embodiments, a portion of the first metal gate line 54 is configured as a gate electrode 54G, and the gate electrode 54G and a pair of first source/drain regions 42 disposed on opposing sides of the gate electrode 54G form a first transistor device 62. A portion of the second metal gate line 56 is configured as a gate electrode 56G, and the gate electrode 56G and a pair of second source/drain regions 44 disposed on opposing sides of the gate electrode 56G form a second transistor device 64.

Referring to FIG. 9 and FIG. 10, the semiconductor device 1 includes a pair of transistor devices such as a first transistor device 62 and a second transistor device 64 formed over a fully depleted silicon-on-insulator (FDSOI) substrate. The first transistor device 62 and the second transistor device 64 share the same active area, and thus layout density can be improved. The first source/drain region 42 of the first transistor device 62 and the second source/drain region 44 of the second transistor device 64 formed in the continuous active area (the same active area 16) are isolated by the isolation region 20. In some embodiments, the semiconductor base 11 has the same doping type as the isolation region 20, but is not limited thereto. The semiconductor base 11 may be a doped substrate, or may have a doped well having the same doping type as the isolation region. The semiconductor base 11 has a lower doping concentration than the isolation region 20. The isolation region 20 has a doping type opposite to that of the first source/drain region 42 and the second source/drain region 44. Accordingly, the first source/drain region 42, the second source/drain region 44 and the isolation region 20 cooperatively form two diode devices electrically connected in a back to back manner.

Figure 11B:
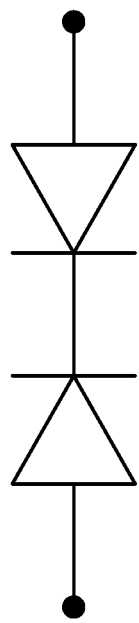
FIG. 11B illustrates an equivalent circuit according to one or more embodiments of the present disclosure.
Figure 11A:
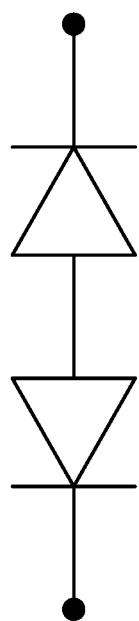
FIG. 11A illustrates an equivalent circuit according to one or more embodiments of the present disclosure.

The back-to-back connected diode devices are able to provide isolation between the first source/drain region 42 of the first transistor device 62 and the second source/drain region 44 of the second transistor device 64, thereby alleviating interference between the first transistor device 62 and the second transistor device 64. As long as the voltage difference between the anode and the cathode of the diode devices is lower than the breakdown voltage of the diode device, the isolation region 20 is able to provide isolation between the first source/drain region 42 of the first transistor device 62 and the second source/drain region 44 of the second transistor device 64. By way of examples, when the first transistor device 62 and the second transistor device 64 are NMOS transistor devices, the first source/drain region 42 and the second source/drain region 44 are N type, while the isolation region 20 is P type. Accordingly, the anodes of the two diode devices are electrically connected to each other, while the cathodes of the two diode devices are respectively electrically connected to the first source/drain region 42 of the first transistor device 62 and the second source/drain region 44 of the second transistor device 64 as illustrated in FIG. 11A. When the first transistor device 62 and the second transistor device 64 are PMOS transistor devices, the first source/drain region 42 and the second source/drain region 44 are P type, while the isolation region 20 is N type. Accordingly, the cathodes of the two diode devices are electrically connected to each other, while the anodes of the two diode devices are respectively electrically connected to the first source/drain region 42 of the first transistor device 62 and the second source/drain region 44 of the second transistor device 64 as illustrated in FIG. 11B.

In some embodiments, the pair of second isolation regions 16D may be formed between the isolation region 20 and the first source/drain region 42, and between the isolation region 20 and the second source/drain region 44. The pair of second isolation regions 16D has the same doping type as the isolation region 20, but a lower doping concentration than the isolation region 20. The isolation region 20 and the second isolation regions 16D have the doping type opposite to that of the first source/drain region 42 and the second source/drain region 44. Accordingly, the first source/drain region 42, the second source/drain region 44 and the isolation region 20 cooperatively form two diode devices electrically connected in a back to back manner. As long as the voltage difference between the positive node and the negative node of the diode device is lower than the breakdown voltage of the diode device, the isolation region 20 is able to provide isolation between the first source/drain region 42 of the first transistor device 62 and the second source/drain region 44 of the second transistor device 64. In some embodiments, the second isolation region 16D with the same doping type but lower doping concentration may help to reduce leakage of the isolation region 20.

During fabrication of the semiconductor device 1 (as illustrated in FIGS. 4-6), the second gate line 34 equally spaced with the first gate line 32 and the third gate line 36 is formed due to design rule and photolithography considerations. Since the isolation region 20 overlaps the second gate line 34, extra layout area for accommodating the isolation region 20 may be omitted.

The semiconductor device and its manufacturing method of the present disclosure are not limited to the abovementioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 12:
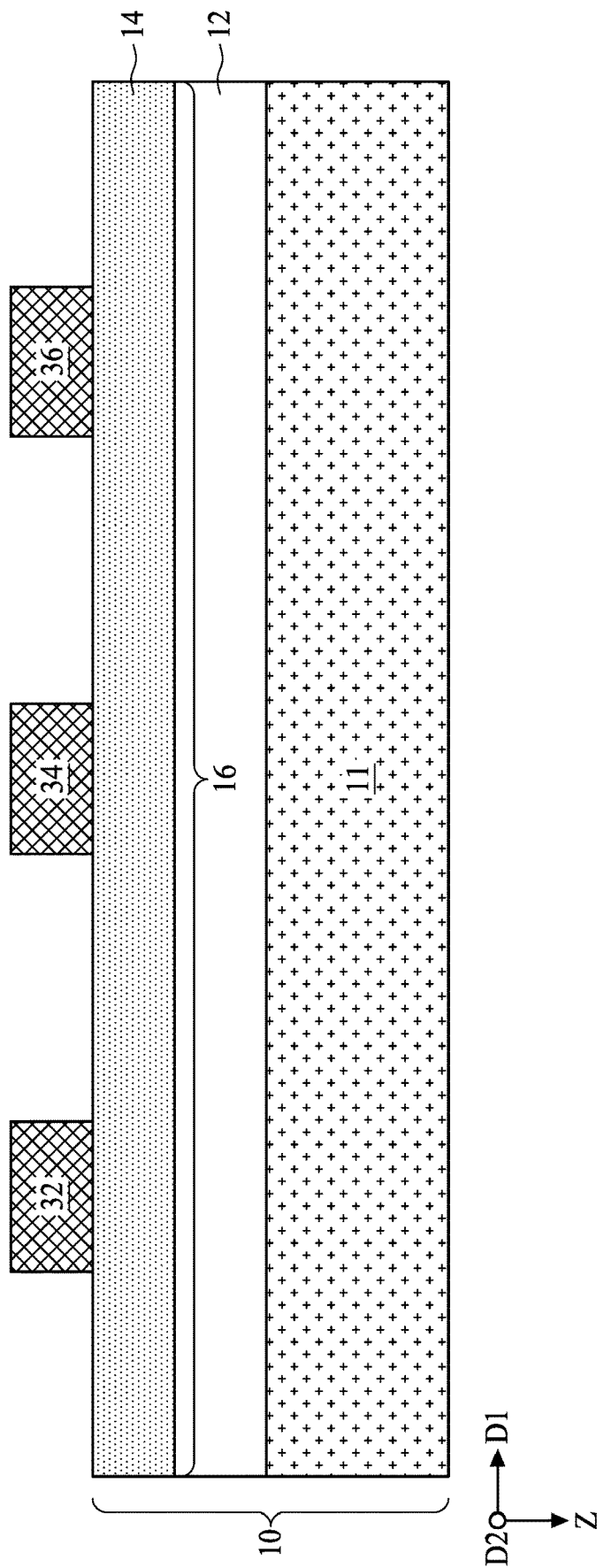
FIGS. 12-18 are schematic views at one of various operations of manufacturing a semiconductor device according to one or more embodiments of the present disclosure.
Figure 16:
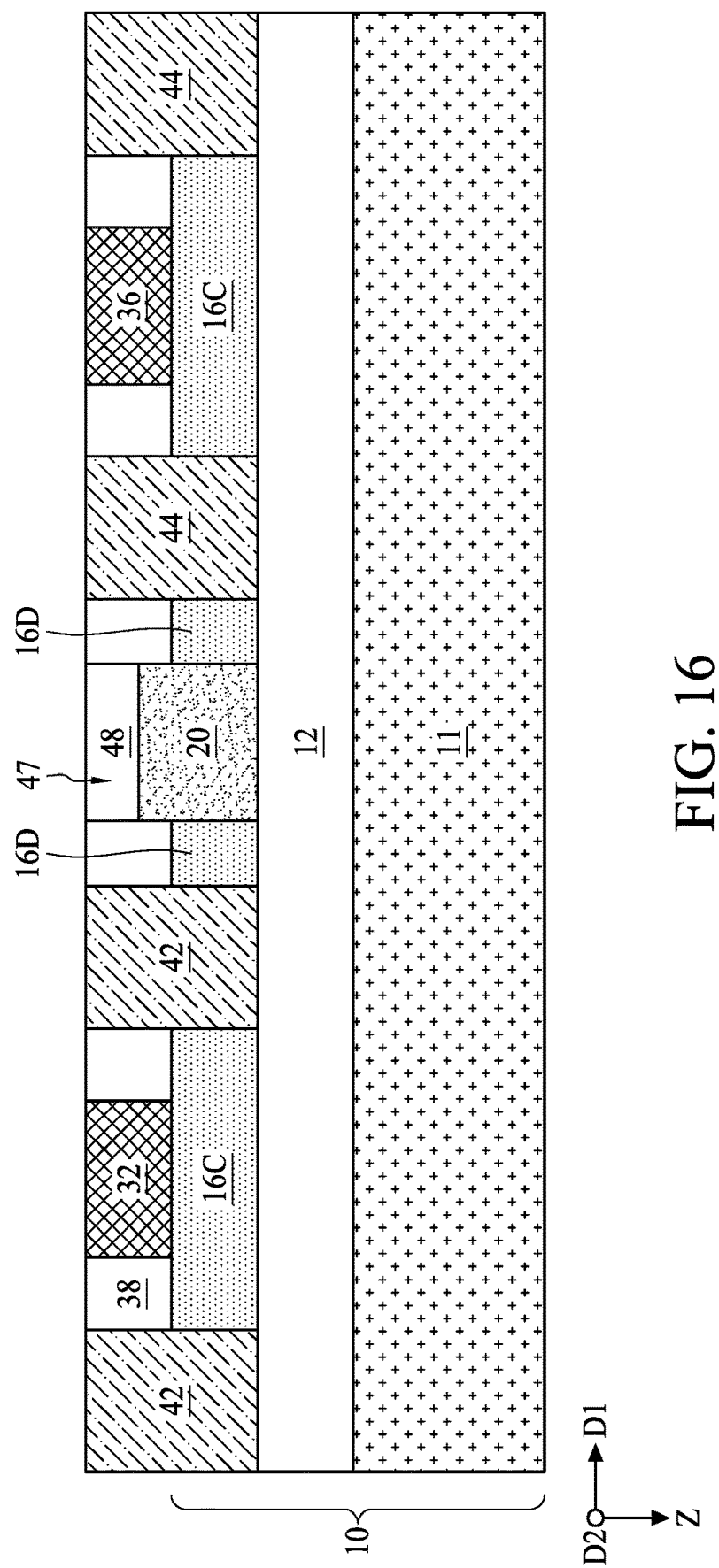
Figure 17:
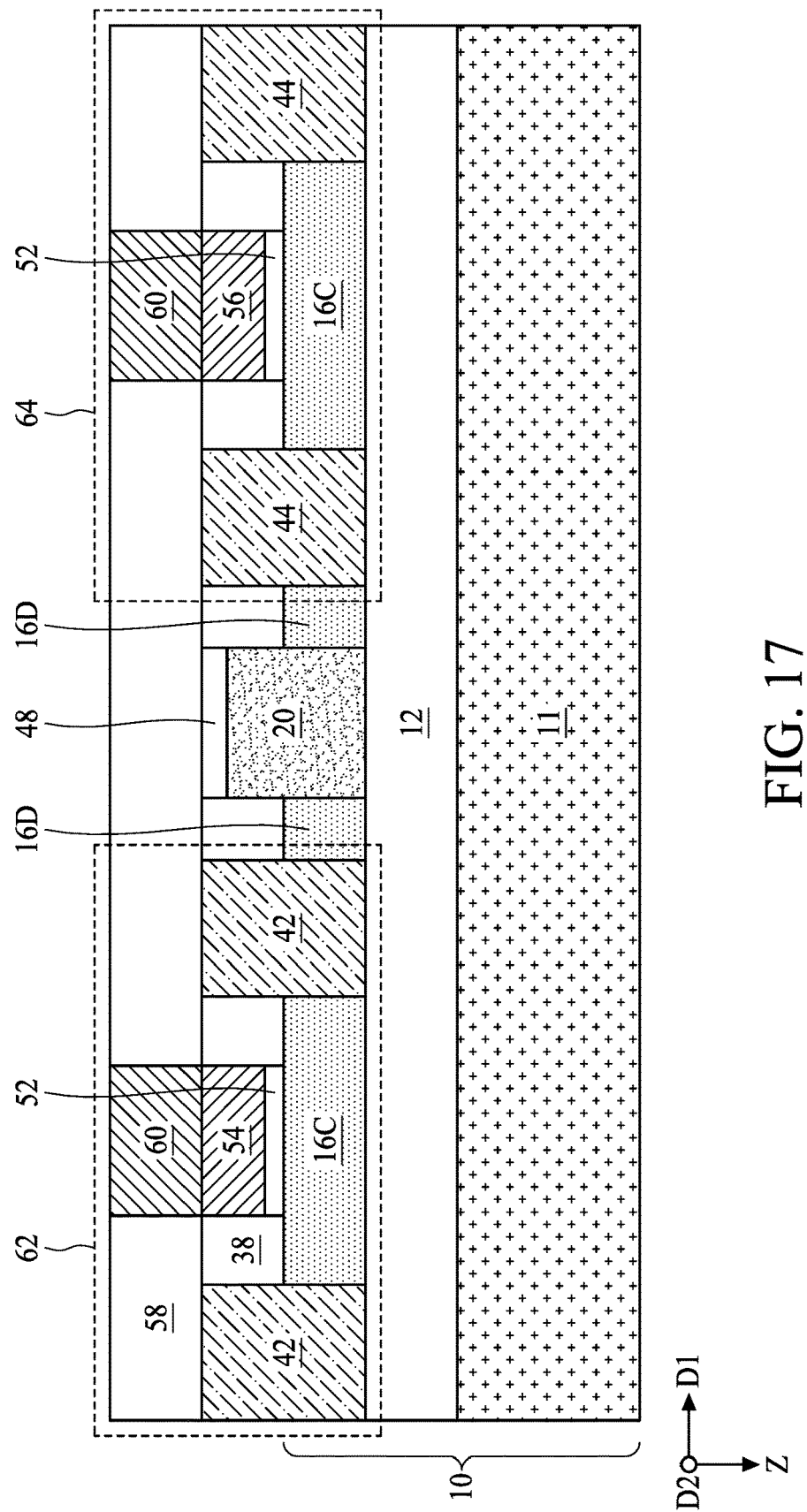
Figure 18:
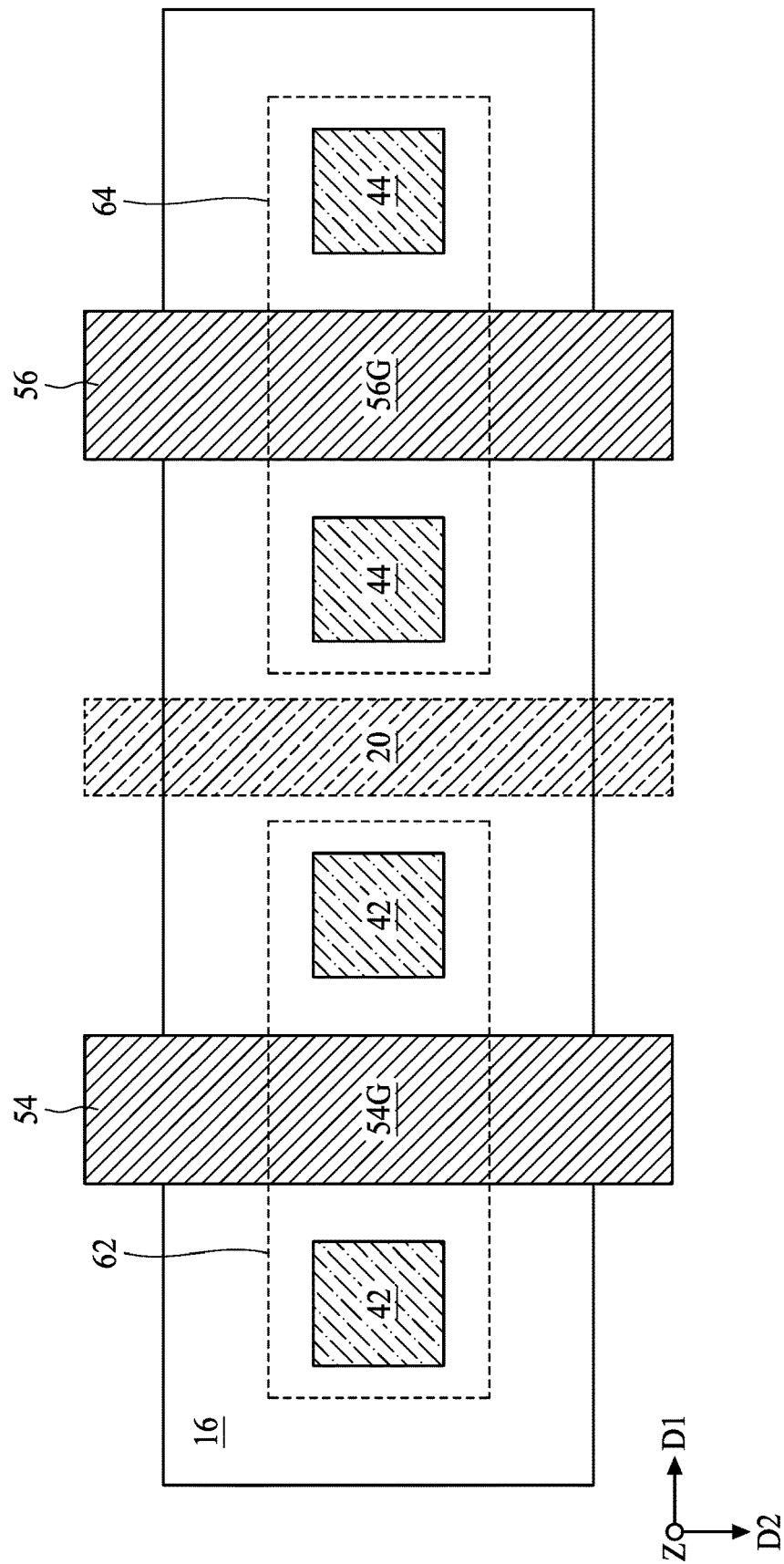

FIGS. 12-18 are schematic views at one of various operations of manufacturing a semiconductor device according to one or more embodiments of the present disclosure, where FIGS. 12-17 are schematic cross-sectional views, and FIG. 18 is a schematic top view. As shown in FIG. 12, a substrate 10 is received. In some embodiments, the substrate 10 may be a composite substrate such as a semiconductor-on-insulator (SOI) substrate including a semiconductor base 11, an insulation layer 12 over the semiconductor base 11, and a semiconductor layer 14 over the insulation layer 12. The semiconductor layer 14 may be doped to form an active area 16 having the first doping type. Subsequently, a plurality of gate lines are formed over the substrate 10. In some embodiments, a first gate line 32, a second gate line 34 and a third gate line 36 are formed over the active area 16. The first gate line 32, the second gate line 34 and the third gate line 36 may be sacrificial gate lines, and will be removed in subsequent operations. The first gate line 32, the second gate line 34 and the third gate line 36 may include semiconductor gate lines such as polycrystalline gate lines, but are not limited thereto.

Figure 13:
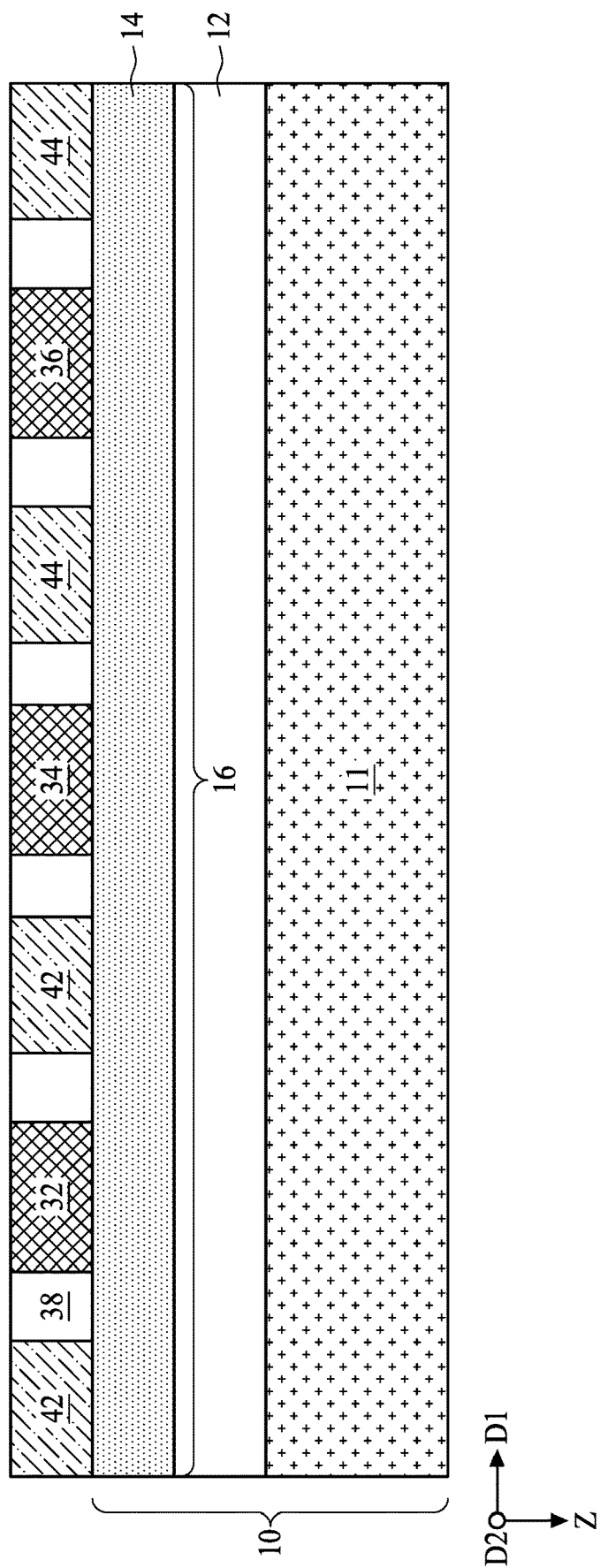

As shown in FIG. 13, a plurality of side spacers 38 may be formed alongside the first gate line 32, the second gate line 34 and the third gate line 36. A plurality of source/drain regions are also formed over the substrate 10. By way of example, a pair of first source/drain regions 42 are formed alongside the first gate line 32, and a pair of second source/drain regions 44 are formed alongside the third gate line 36. The first source/drain regions 42 and the second source/drain regions 44 may have a second doping type opposite to the first doping type of the isolation region 20.

Figure 14:
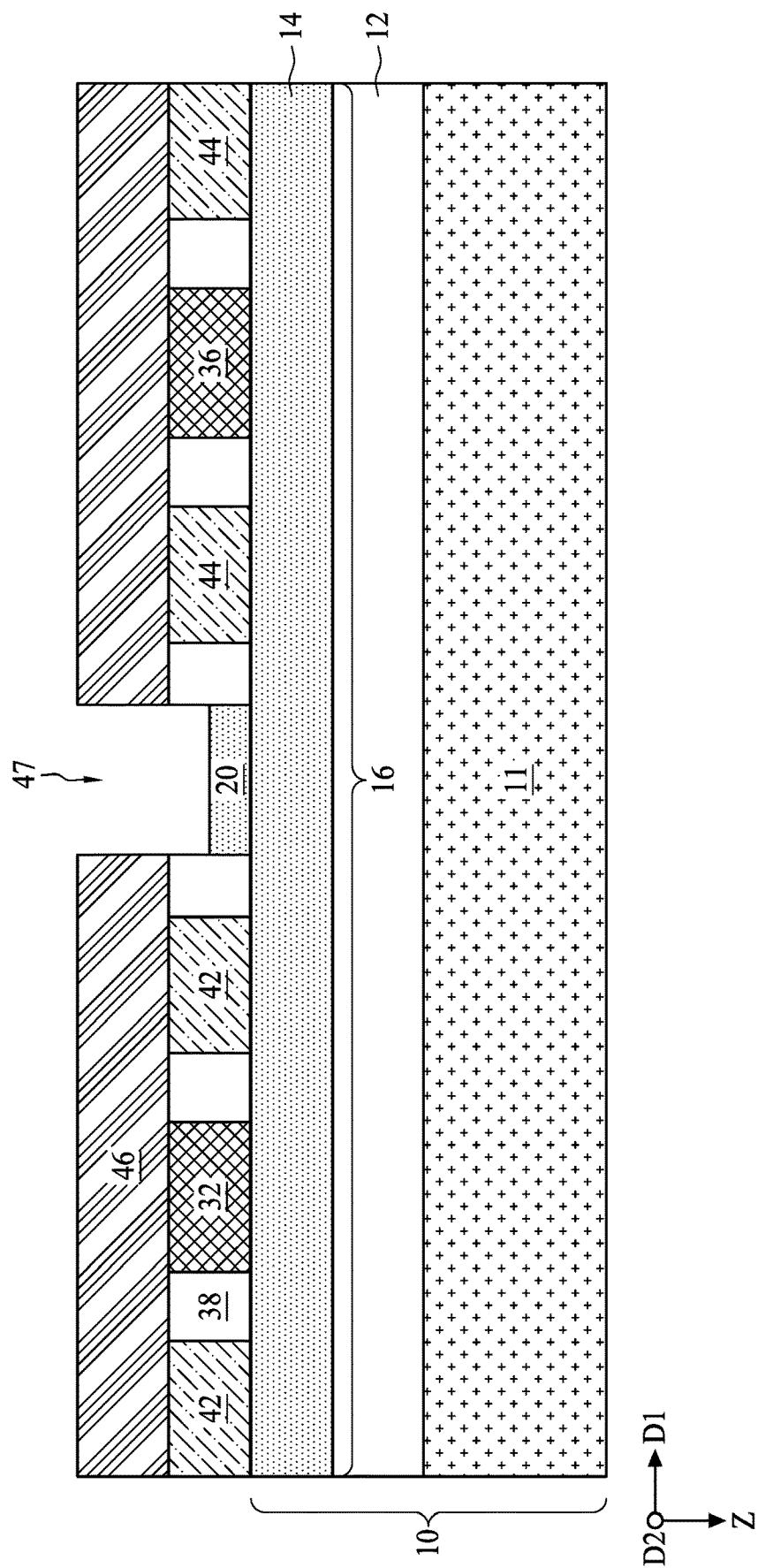

As shown in FIG. 14, the second gate line 34 is removed. In some embodiments, a patterned mask layer 46 may be formed, and the second gate line 34 exposed through the patterned mask layer 46 is removed by etching, for example, to form a recess 47 partially exposing the active area 16.

Figure 15:
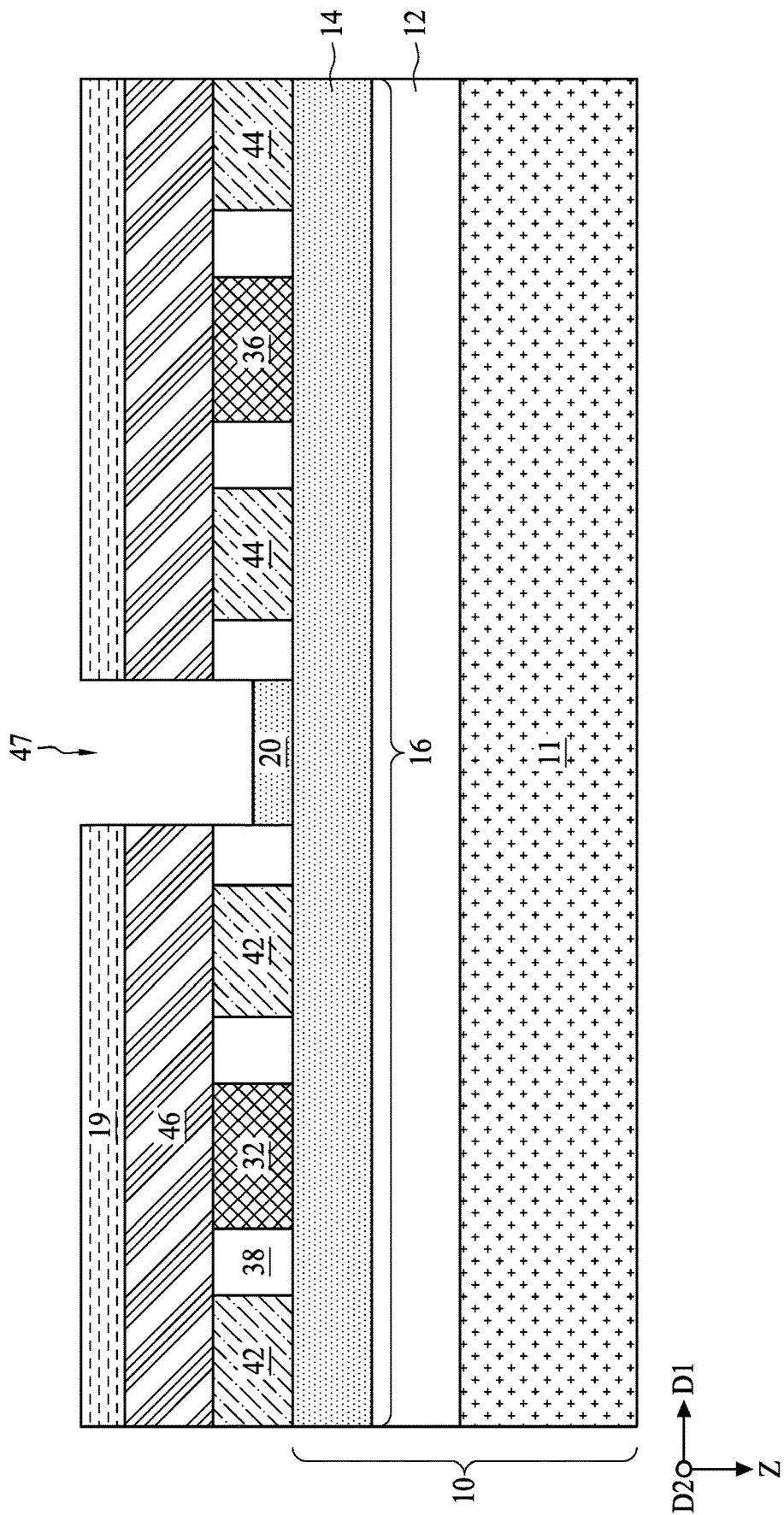

As shown in FIG. 15, a semiconductor material 19 may be formed over the patterned mask layer 46 and in the bottom of the recess 47. The semiconductor material 19 has the first doping type opposite to the second doping type of the first source/drain regions 42 and the second source/drain regions 44. The semiconductor material 19 formed in the bottom of the recess 47 may be configured as an isolation region 20. In some embodiments, the dimension of the isolation region 20 may be equal to the dimension of the second gate line 34, which is removed.

As shown in FIG. 16, a thermal operation such as an anneal operation may be performed to drive in the dopants of the first source/drain regions 42 and the second source/drain regions 44 into the active area 16, and drive in the dopants of the isolation region 20 into the active area 16. In some embodiments, the thickness of the isolation region 20 is larger than the thickness of the active area 16. The semiconductor material 19 may be removed along with the patterned mask layer 46 after the thermal operation. In some embodiments, a dielectric layer 48 is formed in the recess 47, covering the isolation region 20. The dielectric layer 48 may be formed over the substrate 10, and the dielectric layer 48 outside the recess 47 may be removed by, e.g., chemical mechanical polishing (CMP) or the like.

In some embodiments, the first source/drain regions 42, the second source/drain regions 44 and the isolation region 20 may divide the active area 16 into several portions. For example, the portions of the active area 16 between the pair of the first source/drain regions 42 and between the pair of the second source/drain regions 44 are configured as two channels 16C of two adjacent transistor devices to be formed. The thickness of the isolation region 20 is larger than the thickness of the active area 16, but not limited thereto. The portions of the active area 16 between the first source/drain region 42 and the isolation region 20, and between the second source/drain region 44 and the isolation region 20 are configured as a pair of second isolation regions 16D. Accordingly, the second isolation regions 16D are disposed on two opposing sides of the isolation region 20. The doping concentration of the isolation region 20 is higher than the doping concentration of the pair of the second isolation regions 16D.

As shown in FIG. 17 and FIG. 18, gate dielectric layers 52, a first metal gate line 54, a second metal gate line 56, an ILD 58, and a plurality of contact vias 60 may be formed in a similar manner as illustrated in FIGS. 8-10 to form a semiconductor device 2.

Referring to FIG. 17 and FIG. 18, the isolation region 20 has a doping type opposite to that of the first source/drain region 42 and the second source/drain region 44 Accordingly, the first source/drain region 42, the second source/drain region 44 and the isolation region 20 cooperatively form two diode devices electrically connected in a back to back manner. As long as the voltage difference between the positive node and the negative node of the diode device is lower than the breakdown voltage of the diode device, the isolation region 20 is able to provide isolation between the first source/drain region 42 of the first transistor device 62 and the second source/drain region 44 of the second transistor device 64. By way of examples, when the first transistor device 62 and the second transistor device 64 are NMOS transistor devices, the first source/drain region 42 and the second source/drain region 44 are N type, while the isolation region 20 is P type. When the first transistor device 62 and the second transistor device 64 are PMOS transistor devices, the first source/drain region 42 and the second source/drain region 44 are P type, while the isolation region 20 is N type.

In some embodiments, the pair of second isolation regions 16D may be formed between the isolation region 20 and the first source/drain region 42, and between the isolation region 20 and the second source/drain region 44. The second isolation region 16D has the same doping type as the isolation region 20, but a lower doping concentration than the isolation region 20. The isolation region 20 and the second isolation region 16D have the doping type opposite to that of the first source/drain region 42 and the second source/drain region 44, thereby forming two back-to-back connected diode devices. As long as the voltage difference between the positive node and the negative node of the diode device is lower than the breakdown voltage of the diode device, the isolation region 20 is able to provide isolation between the first source/drain region 42 of the first transistor device 62 and the second source/drain region 44 of the second transistor device 64.

Figure 19:
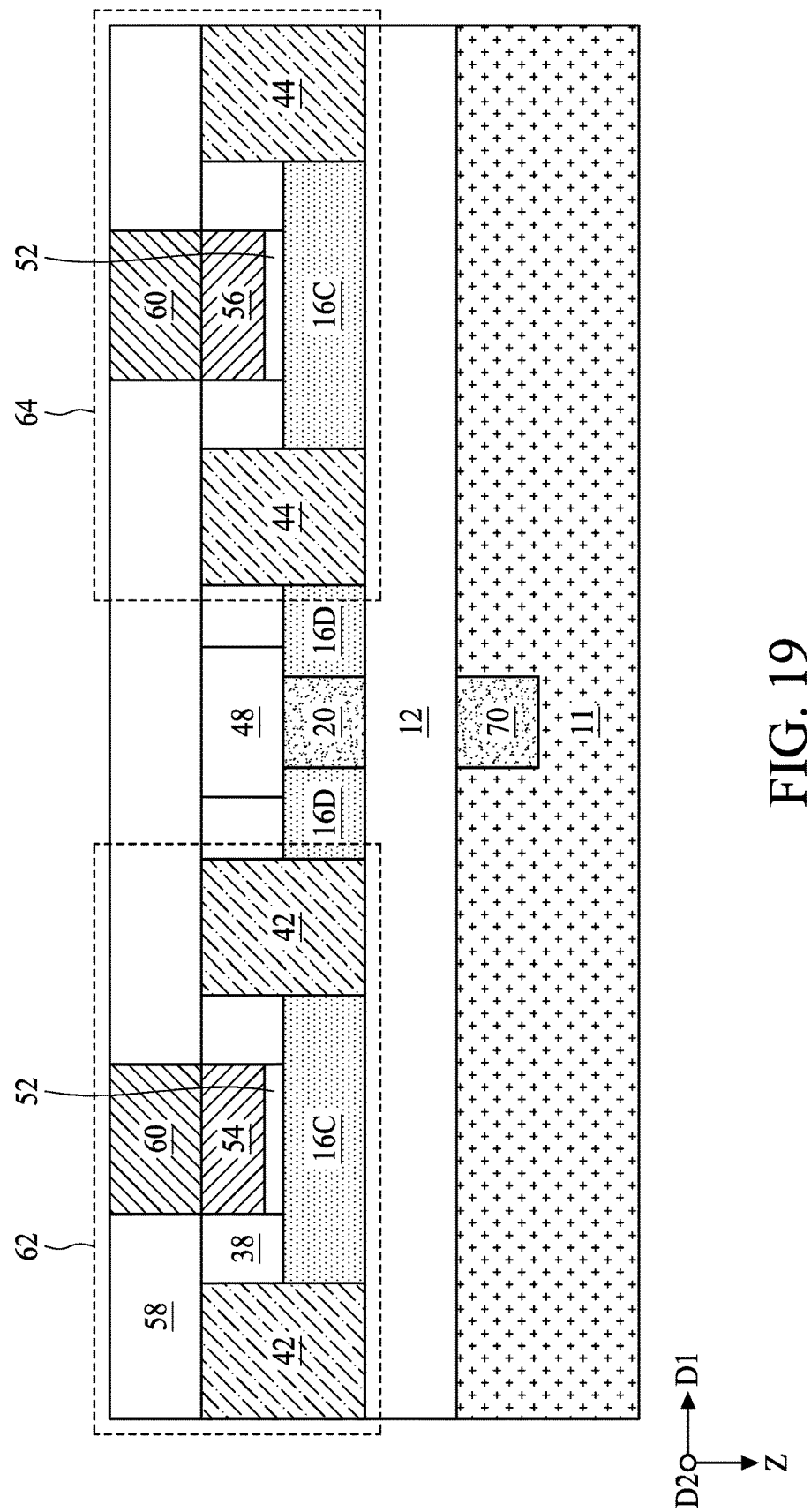
FIG. 19 is a schematic view of a semiconductor device according to one or more embodiments of the present disclosure.

FIG. 19 is a schematic view of a semiconductor device according to one or more embodiments of the present disclosure. As shown in FIG. 19, the semiconductor device 3 may has a flip well scheme, in which the semiconductor base 11 has a doping type opposite to that of the isolation region 20. The semiconductor device 3 further includes a bottom isolation region 70 in the semiconductor base 11. The bottom isolation region 70 has the same doping type as the isolation region 20. In some embodiments, the doping concentration of the isolation region 20 may be substantially equal to the doping concentration of the bottom isolation region 70. In some embodiments, the second isolation region 70 is substantially aligned with the isolation region 20. The bottom isolation region 70 may abut the insulation layer 12. The bottom isolation region 70 may help to enhance the isolation between the first source/drain region 42 of the first transistor device 62 and the second source/drain region 44 of the second transistor device 64. In some embodiments, other components of the semiconductor device 3 may be similar to that of the semiconductor device 1 as shown in FIG. 9. In some other embodiments, other components of the semiconductor device 3 may be similar to that of the semiconductor device 2 as shown in FIG. 17.

Figure 20:
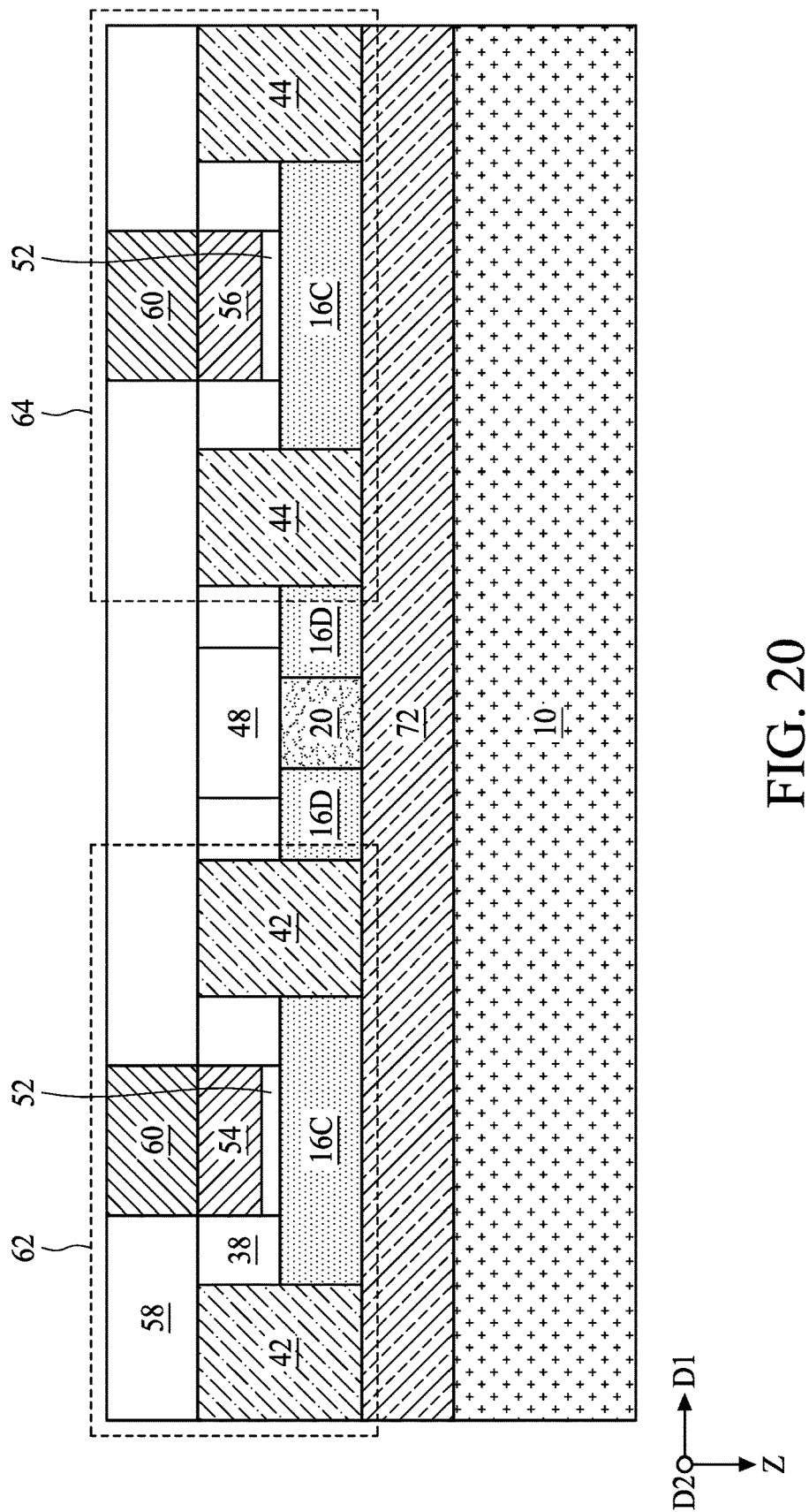
FIG. 20 is a schematic view of a semiconductor device according to one or more embodiments of the present disclosure.

FIG. 20 is a schematic view of a semiconductor device according to one or more embodiments of the present disclosure. As shown in FIG. 20, the substrate 10 of the semiconductor device 4 is a bulk semiconductor substrate. The material of the substrate 10 may comprise elementary semiconductor such as silicon or germanium; a compound semiconductor such as silicon germanium, silicon carbide, gallium arsenic, gallium phosphide, indium phosphide or indium arsenide; or combinations thereof. The semiconductor device 4 includes an anti-punch through layer 72 between the substrate 10 and the first/second transistor devices 62/64, and between the substrate 10 and the isolation region 20. The anti-punch through layer 72 may have the same doping type as the isolation region 20. In some embodiments, the doping concentration of the isolation region 20 is substantially equal to the doping concentration of the anti-punch through layer 72, but not limited thereto. For example, the doping concentration of the isolation region 20 may be higher than the doping concentration of the anti-punch through layer 72. In some embodiments, the anti-punch through layer 72 and the isolation region 20 may be in contact with each other, and may be electrically connected to a reference voltage. The anti-punch through layer 72 may be configured to alleviate punch through current, while the isolation region 20 may be configured to provide isolation between the first/second transistor devices 62/64.

Figure 21B:
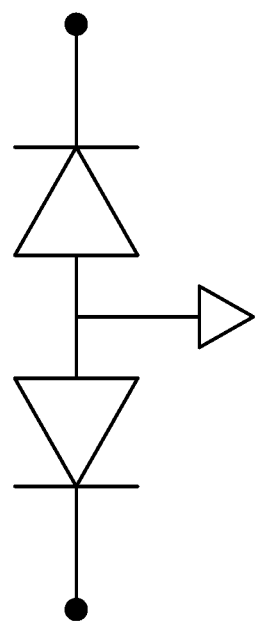
FIG. 21B illustrates an equivalent circuit according to one or more embodiments of the present disclosure.
Figure 21A:
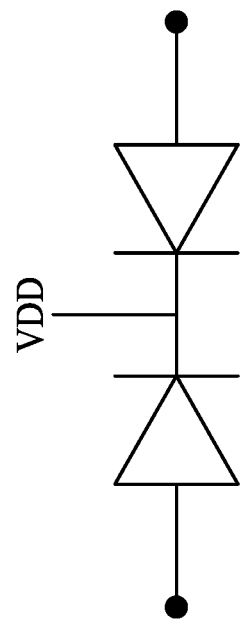
FIG. 21A illustrates an equivalent circuit according to one or more embodiments of the present disclosure.

When the first transistor device 62 and the second transistor device 64 are NMOS transistor devices, the first source/drain region 42 and the second source/drain region 44 are N type, while the isolation region 20 and the anti-punch through layer 72 are P type. Accordingly, the anodes of the two diode devices are electrically connected to a reference voltage such as a ground voltage, while the cathodes of the two diode devices are respectively electrically connected to the first source/drain region 42 of the first transistor device 62 and the second source/drain region 44 of the second transistor device 64 as illustrated in FIG. 21A. When the first transistor device 62 and the second transistor device 64 are PMOS transistor devices, the first source/drain region 42 and the second source/drain region 44 are P type, while the isolation region 20 and the anti-punch through layer 72 are N type. Accordingly, the cathodes of the two diode devices are electrically connected to a reference voltage such as VDD, while the anodes of the two diode devices are respectively electrically connected to the first source/drain region 42 of the first transistor device 62 and the second source/drain region 44 of the second transistor device 64 as illustrated in FIG. 21B.

Figure 22:
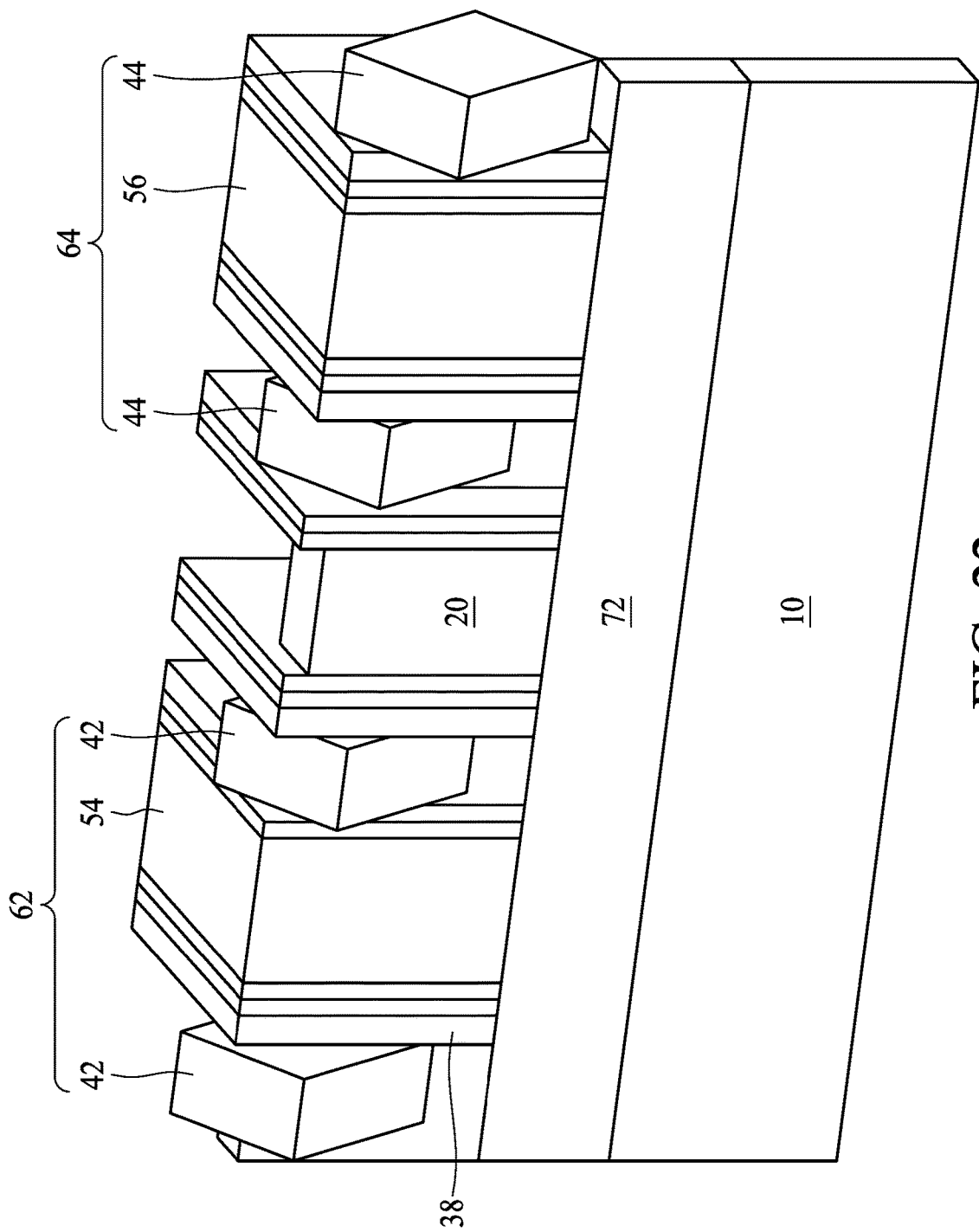
FIG. 22 is a schematic view of a semiconductor device according to one or more embodiments of the present disclosure.

FIG. 22 is a schematic view of a semiconductor device according to one or more embodiments of the present disclosure. As shown in FIG. 22, the first transistor device 62 and the second transistor device 64 of the semiconductor device 5 may include fin field effect transistor (FinFET) transistors. In some embodiments, the isolation region 20 is disposed between the substrate 10 and the first/second transistor devices 62/64, and between the substrate 10 and the isolation region 20. In some embodiments, the doping concentration of the anti-punch through layer 72 is substantially equal to the doping concentration of the isolation region 20. In some embodiments, the anti-punch through layer 72 and the isolation region 20 may be in contact with each other, and may be electrically connected to a reference voltage. The anti-punch through layer 72 may be configured to alleviate punch through current, while the isolation region 20 may be configured to provide isolation between the first/second transistor devices 62/64.

Figure 23:
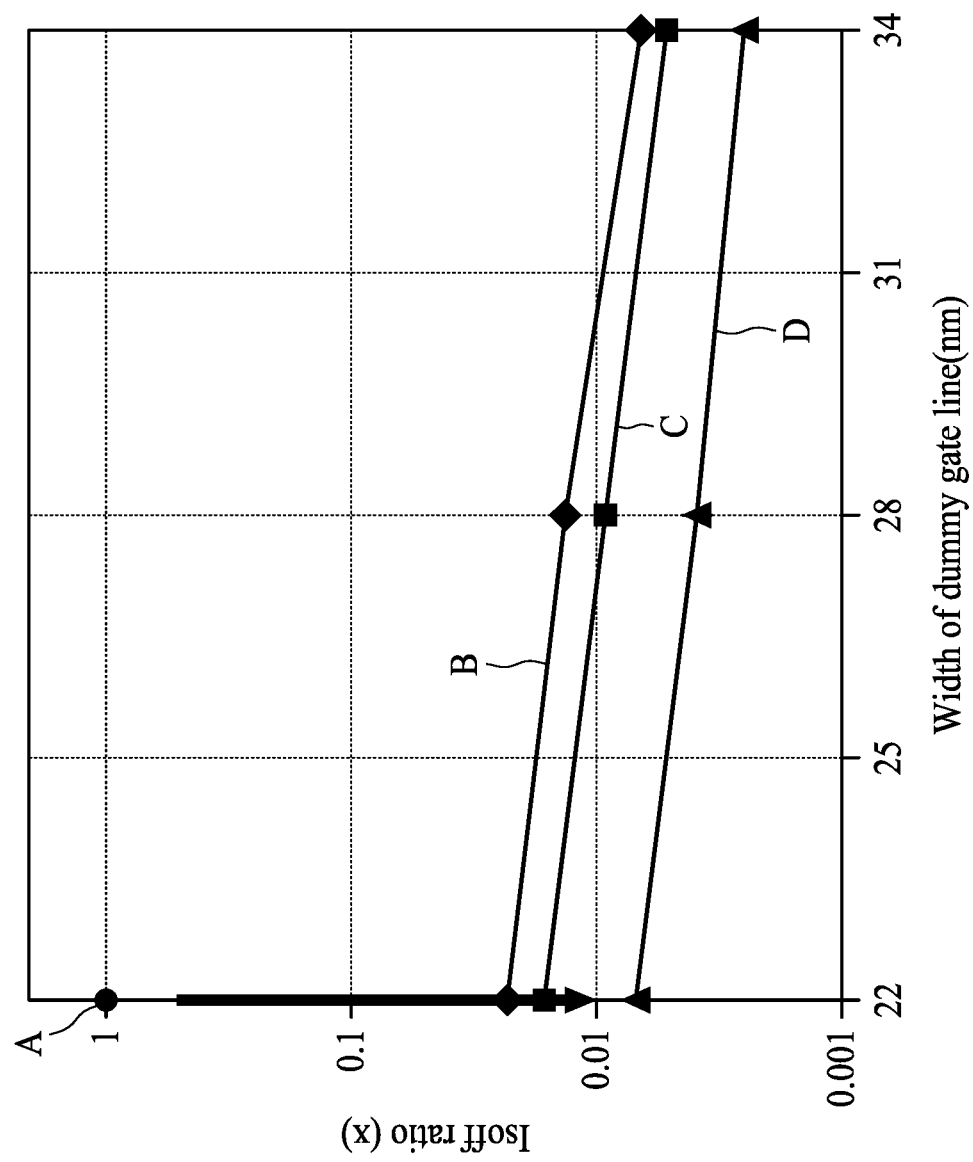
FIG. 23 is a simulation result illustrating a relation between Isoff and width of a dummy gate line corresponding to the isolation region.

FIG. 23 is a simulation result illustrating a relation between Isoff and width of a dummy gate line corresponding to the isolation region. Sample A represents a semiconductor device in the absence of an isolation region formed under the dummy gate line. Samples B-D represent a semiconductor device includes an isolation region with a different doping concentration formed under the dummy gate line, wherein the doping concentration in sample C is lower than the doping concentration in sample B, and the doping concentration in sample D is lower than the doping concentration in sample C. As shown in FIG. 23, the semiconductor devices with the isolation region (samples B-D) has lower leakage current in contrast to the semiconductor device without the isolation region (sample A).

In some embodiments of the present disclosure, the semiconductor device includes an isolation region between the source/drain regions of adjacent transistor devices. The isolation region has a doping type opposite to the doping type of the source/drain regions, thereby forming two diode devices connected in a back to back manner. The back-to-back connected diode devices are able to provide lateral isolation between the source/drain regions of adjacent transistor devices as long as the voltage difference between the positive node and the negative node of the diode device is lower than the breakdown voltage of the diode device. The isolation region may be formed in the same active area as the channels of the transistor devices, and thus can reduce manufacturing costs and overall height of the semiconductor device. The isolation region may be formed underneath a dummy gate line, which is formed due to design rule and photolithography considerations, and will be removed. Accordingly, extra layout area for accommodating the isolation region can be omitted.

In some embodiments, a method for manufacturing a semiconductor device is provided. A substrate including an active area is received. A plurality of source/drain regions of a plurality of transistor devices are formed in the active area. An isolation region is inserted between two adjacent source/drain regions of two adjacent transistor devices, wherein the isolation region and the two adjacent source/drain regions cooperatively form two diode devices electrically connected in a back to back manner.

In some embodiments, a method for manufacturing a semiconductor device is provided. A substrate including an active area is received. An ion implantation is performed to form a first isolation region in the active area. A pair of transistor devices is formed over the substrate. In some embodiments, each of the pair of the transistor devices includes a channel, a gate electrode over the channel and a source/drain region alongside of the gate electrode. A pair of second isolation region is formed on two opposing sides of the isolation region. In some embodiments, the first isolation region and the pair of second isolation regions have a first doping type, and a doping concentration of the pair of second isolation regions is lower than that of the first isolation region.

In some embodiments, a method for manufacturing a semiconductor device is provided. A substrate including an active area is received. A first sacrificial gate line and a plurality of second sacrificial gate lines are formed over the substrate. In some embodiments, the first sacrificial gate line is formed between two of adjacent second sacrificial gate lines. A plurality of source/drain regions is formed over the substrate alongside each of the pair of sacrificial gate lines. The first sacrificial gate line is removed to form a first recess exposing a portion of the active area. An isolation region is formed in the first recess. Each of the second sacrificial gate lines is replaced with a metal gate line.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    receiving a substrate including an active area having a first doping concentration of a first doping type;
    forming a plurality of source/drain regions of a plurality of transistor devices in the active area;
    inserting an isolation region in the active area between two adjacent source/drain regions of two adjacent transistor devices, wherein the isolation region has a second doping concentration of the first doping type and higher than the first doping concentration, and the isolation region and the two adjacent source/drain regions cooperatively form two diode devices electrically connected in a back to back manner; and
    performing a thermal operation to drive in dopants of the isolation region having the second doping concentration into the active area of the first doping type to form a pair of second isolation regions having a third doping concentration of the first doping type on opposite sides of the isolation region having the first doping concentration.

2. The method of claim 1, further comprising forming an anti-punch through layer under the active area, the source/drain regions and the isolation region, and connecting the isolation region to the anti-punch through layer.

3. The method of claim 1, wherein the forming of the pair of transistor devices further comprises:
    forming a first sacrificial gate line over the isolation region and a pair of second sacrificial gate lines over the active area;
    forming a side spacer alongside the first sacrificial gate line and each of the pair of second sacrificial gate lines; and
    forming a plurality of source/drain regions over the substrate alongside each of the pair of second sacrificial gate lines.

4. A method for manufacturing a semiconductor device, comprising:
    receiving a substrate comprising an active area;
    performing an ion implantation to form a first isolation region in the active area;
    forming a pair of transistor devices over the substrate, wherein each of the pair of the transistor devices comprises a channel, a gate electrode over the channel, and a source/drain region alongside the gate electrode; and
    forming a pair of second isolation regions on two opposing sides of the first isolation region,
    wherein the first isolation region and the pair of second isolation regions have a first doping type, and a doping concentration of the pair of second isolation regions is lower than that of the first isolation region, and
    wherein the forming of the pair of transistor devices further comprises:
    forming a first sacrificial gate line over the first isolation region and a pair of second sacrificial gate lines over the active area;
    forming a side spacer alongside the first sacrificial gate line and each of the pair of second sacrificial gate lines; and
    forming a plurality of source/drain regions over the substrate alongside each of the pair of second sacrificial gate lines.

5. The method of claim 4, wherein the active area has the first doping type, and a doping concentration of the active area is lower than that of the first isolation region.

6. The method of claim 4, wherein the source/drain regions having a second doping type opposite to the first doping type.

7. The method of claim 4, wherein the forming of the second isolation regions and the forming of the plurality of source/drain regions are simultaneously performed.

8. The method of claim 4, further comprising:
removing the first sacrificial gate line to form a first recess exposing the first isolation region; and
forming a dielectric layer to fill the first recess.

9. The method of claim 8, wherein a width of the dielectric layer is greater than a width of the first isolation region.

10. The method of claim 4, further comprising:
removing the pair of second sacrificial gate lines to form a pair of second recesses; and
forming a metal gate line in each of the pair of second recesses.

11. The method of claim 4, wherein the forming of the second isolation regions comprises performing a thermal operation to drive in dopants of the first isolation region into the active area to form the second isolation regions.

12. The method of claim 4, further comprising:
forming an inter-layered dielectric (ILD) over the substrate; and
forming a contact via coupled to each of the pair of transistor devices.

13. The method of claim 4, wherein the substrate further comprises a semiconductor base, an insulation layer over the semiconductor base, and a bottom isolation region in the semiconductor base, wherein the bottom isolation region comprises the first doping type, the bottom isolation region is substantially aligned with the first isolation region, and a doping concentration of the bottom isolation region is substantially equal to the doping concentration of the first isolation region.

14. The method of claim 4, wherein the substrate further comprises a semiconductor base and an anti-punch through layer over the semiconductor base, and the anti-punch through layer comprises the first doping type.

15. A method for manufacturing a semiconductor device, comprising:
receiving a substrate comprising an active area;
forming a first isolation region in the active area;
forming a pair of transistor devices over the substrate, wherein each of the pair of the transistor devices comprises a channel, a gate electrode over the channel, and a source/drain region alongside the gate electrode; and
forming a pair of second isolation regions on two opposing sides of the first isolation region,
wherein the first isolation region and the pair of second isolation regions have a first doping type, and a doping concentration of the pair of second isolation regions is lower than that of the first isolation region, and
wherein the forming of the pair of transistor devices further comprises:
forming a first sacrificial gate line over the first isolation region and a pair of second sacrificial gate lines over the active area;
forming a side spacer alongside the first sacrificial gate line and each of the pair of second sacrificial gate lines; and
forming a plurality of source/drain regions over the substrate alongside each of the pair of second sacrificial gate lines.

16. The method of claim 15, wherein the active area has the first doping type, and a doping concentration of the active area is lower than that of the first isolation region.

17. The method of claim 15, wherein a thickness of the first isolation region is substantially equal to a thickness of each of the second isolation regions.

18. The method of claim 15, wherein a thickness of the first isolation region is substantially equal to a thickness of the channel.

19. The method of claim 15, further comprising forming a dielectric layer on the first isolation region and the second isolation regions.

20. The method of claim 19, wherein the dielectric layer partially covers each of the second isolation regions and partially exposes each of the second isolation regions.

* * * * *